United States Patent
Nii

(10) Patent No.: US 6,807,081 B2
(45) Date of Patent: Oct. 19, 2004

(54) SEMICONDUCTOR MEMORY CIRCUIT HARD TO CAUSE SOFT ERROR

(75) Inventor: Koji Nii, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 10 days.

(21) Appl. No.: 10/238,618

(22) Filed: Sep. 11, 2002

(65) Prior Publication Data

US 2003/0107913 A1 Jun. 12, 2003

(30) Foreign Application Priority Data

Dec. 7, 2001 (JP) ........................................ 2001-373947

(51) Int. Cl.⁷ ............................................... G11C 11/22
(52) U.S. Cl. .................. 365/145; 365/156; 365/189.05; 365/230.05
(58) Field of Search ................................ 365/154, 156, 365/189.05, 230.05, 49

(56) References Cited

U.S. PATENT DOCUMENTS

| | | | | |
|---|---|---|---|---|
| 4,175,290 A | * | 11/1979 | Harari | ..................... 365/185.07 |
| 4,532,609 A | | 7/1985 | Iizuka | |
| 4,956,815 A | * | 9/1990 | Houston | ..................... 365/154 |
| 5,406,107 A | | 4/1995 | Yamaguchi | |
| 5,724,292 A | * | 3/1998 | Wada | .......................... 365/207 |
| 6,091,626 A | * | 7/2000 | Madan | ......................... 365/154 |
| 6,627,690 B1 | * | 9/2003 | Hironaka | ..................... 524/412 |
| 6,627,960 B2 | * | 9/2003 | Nii et al. | ..................... 257/371 |

FOREIGN PATENT DOCUMENTS

| | | |
|---|---|---|
| JP | 57-12486 | 1/1982 |
| JP | 4-278290 | 10/1992 |

* cited by examiner

*Primary Examiner*—Hoai Ho
(74) *Attorney, Agent, or Firm*—McDermott Will & Emery LLP

(57) ABSTRACT

A memory cell of SRAM includes: two N-channel MOS transistors connected in series between a first storage node and a line of a ground potential and two N-channel MOS transistors connected in series between a second storage node and a line of a ground potential. Since no storage data is inverted unless one α-particle passes through two N-channel MOS transistors, a soft error hard to occur.

19 Claims, 21 Drawing Sheets

SEMICONDUCTOR MEMORY CIRCUIT HARD TO CAUSE SOFT ERROR

BACKGROUND OF THE INVENTION

1. Field of the Invention

The present invention relates to a semiconductor memory circuit, and particularly, to a semiconductor memory circuit equipped with two inverters in antiparallel connection.

2. Description of the Background Art

FIG. 25 is a circuit diagram showing a construction of a memory cell 80 of a prior art static random access memory (hereinafter referred to as SRAM). In FIG. 25, memory cell 80 includes: P-channel MOS transistors 81 and 82; and N-channel MOS transistors 83 to 86. P-channel MOS transistors 81 and 82 are connected, respectively, between a line of power supply potential VDD and a storage node N81, and between a line of power supply potential VDD and a storage node N82, and the gates thereof are connected to respective storage nodes N82 and N81. N-channel MOS transistors 83 and 84 are connected, respectively, between a line of ground potential GND and a storage node N81, and between a line of ground potential GND and a storage node N82, and the gates thereof are connected to respective storage nodes N82 and N81. N-channel MOS transistor 85 is connected between a bit line BL and storage node N81, and MOS transistor 86 is connected between a bit line /BL and storage node N82, and the gates thereof are both connected to a word line WL. MOS transistors 81 and 83 constitute an inverter giving an inverted signal of a signal of storage node N82 to storage node N81. MOS transistors 82 and 84 constitutes an inverter giving an inverted signal of a signal of storage node N81 to storage node N82. The two inverters are antiparallel-connected between storage nodes N81 and N82 to constitute a latch circuit.

When word line WL is driven to H level at select level, N-channel MOS transistors 85 and 86 become conductive. When one bit line (for example, BL) of bit lines BL and /BL is driven to H level, and in addition, the other bit line (/BL in this case) is driven to L level according to a write data signal, not only do MOS transistors 81 and 84 become conductive, but MOS transistors 82 and 83 also become non-conductive to thereby latch levels of storage nodes N81 and N82. When word line WL is driven to L level at non-select level, N-channel MOS transistors 85 and 86 become non-conductive to store a data signal into memory cell 80.

In read operation, after bit lines BL and /BL are pre-charged to H level, word line WL is driven to H level at select level. By doing so, a current flows out from bit line (/BL in this case) onto the line of ground potential GND through N-channel MOS transistors 86 and 84 to lower a potential of bit line /BL. By comparison between potentials on bit lines BL and /BL, storage data of memory cell 80 can be read out.

In such a memory cell 80, a so-called soft error has been easy to occur in company with recent progress to high level of integration and to low level of voltage of power supply. Herein, the term soft error is a phenomenon that α-particle radiation emitted from a trace of radioactive material contained in a package strikes a memory cell to invert storage data. This is considered because a soft error is easy to occur since with a higher level of integration, capacities of storage nodes N81 and N82 are smaller and power supply voltage is lowered.

SUMMARY OF THE INVENTION

It is accordingly a main object of the present invention to provide a semiconductor memory circuit, in which storage data is hard to be inverted even when the memory circuit is irradiated with α-particle radiation.

A semiconductor memory circuit according to the present invention includes: two inverters connected between first and second storage nodes, an input node of each inverter being connected to an output node of the other inverter, wherein the inverters each include: plural first transistors with a first conductivity type, connected in series between a line of a first power supply potential and the output node, and whose input electrodes are all connected to the input node; and a second transistor with a second conductivity type, connected in series between a line of a second power supply potential and the output node, and whose input electrode is connected to the input node. Therefore, since an inverter includes the plural first transistors, a capacity of a storage node is larger compared with a prior art case where an inverter includes one first transistor, making storage data hard to be inverted. Furthermore, unless one α-particle passes through the plural first transistors, storage data is not inverted; therefore, the storage data is harder to be inverted compared with a prior case where storage data was inverted by one α-particle passing through one first transistor.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
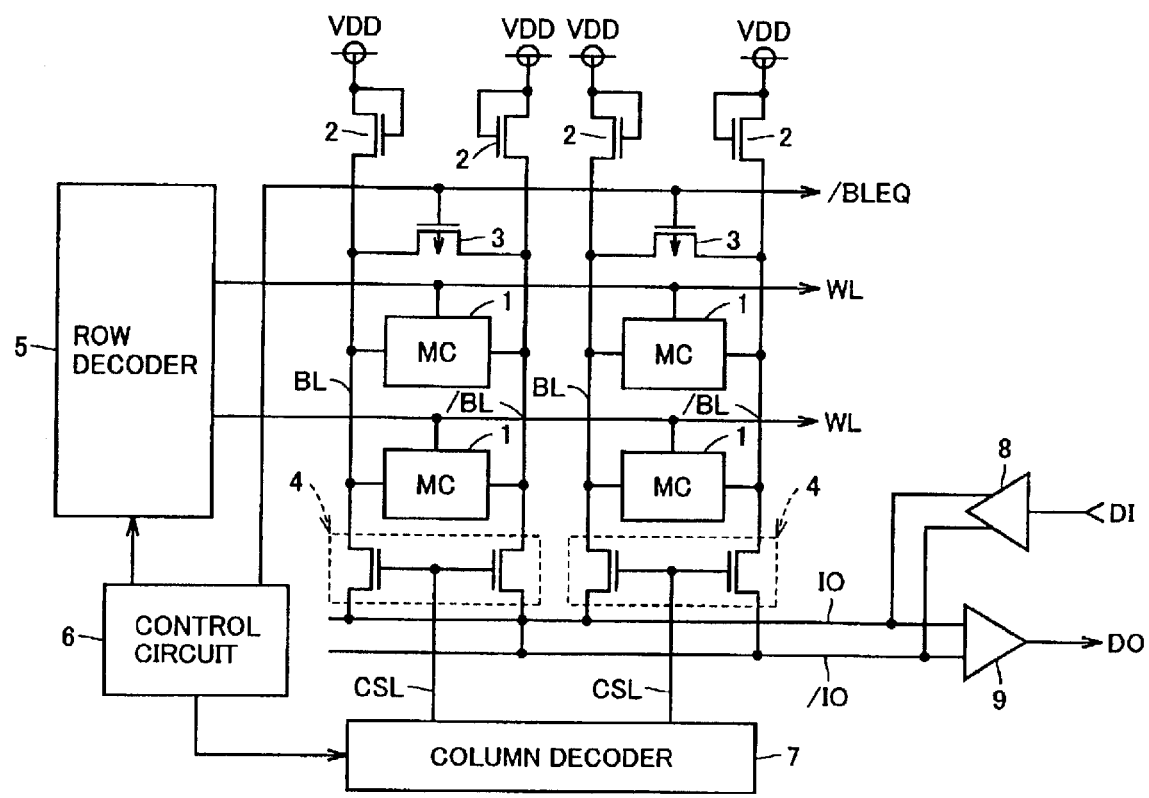
FIG. 1 is a circuit block diagram showing an overall configuration of SRAM according to a first embodiment of the present invention.

FIG. 1 is a block diagram showing a configuration of SRAM according to a first embodiment of the present invention. In FIG. 1, SRAM includes: plural memory cells (MC) 1 (4 cells in this case for simplification in figure and description) arranged in a matrix: word lines WL provided correspondingly to respective rows; and bit line pairs BL and /BL provided correspondingly to respective columns.

Furthermore, SRAM includes: bit line loads 2, provided correspondingly to respective bit lines BL and /BL, and for charging corresponding bit line BL or /BL to a prescribed potential; equalizers 3, provided corresponding to respective bit line pairs BL and /BL, and each for equalizing potentials on a bit line pair BL and /BL with each other; and column select gates 4, provided correspondingly to respective bit line pairs BL and /BL, and each for connecting corresponding bit line pair BL and /BL to respective data input/output line pairs IO and /IO.

Bit line loads 2 each includes an N-channel MOS transistor diode-connected between a line of power supply potential VDD and one end of corresponding bit line BL or /BL. Equalizers 3 each includes a P-channel MOS transistor connected between corresponding bit line pair BL and /BL and receiving a bit line equalize signal /BLEQ at its gate. Column select gates 4 each includes: an N-channel MOS transistor connected between the other end of corresponding bit line BL and one end of data input/output line IO; and an N-channel MOS transistor connected between the other end of corresponding bit line /BL and one end of data input/output line /IO, wherein the gates of the two N-channel MOS transistors are connected to one end of a column select line CSL.

Furthermore, SRAM includes: a row decoder 5; a control circuit 6; a column decoder 7; a write circuit 8; and a read circuit 9. Row decoder 5 raises one word line WL of plural word lines WL to H level at select level according to a row address signal given externally. Control circuit 6 controls all of SRAM according to control signals given externally. Column decoder 7 raises one column select line CSL of plural column select lines to H level at select level according to a column address signal given externally.

Write circuit 8 and read circuit 9 are both connected to the other ends of data input/output line pair IO and /IO. Write circuit 8 writes a data signal DI given externally onto memory cell 1 selected by row decoder 5 and column decoder 7. Read circuit 9 outputs a read data signal DO from memory cell 1 selected by row decoder 5 and column decoder 7 to outside.

Then, description will be given of operation in SRAM shown in FIG. 1. In write operation, word line WL of a row designated by a row address signal is raised to H level at select level by row decoder 5 to activate memory cells 1 on the row. Then, column select line CSL of a column designated by a column address signal is raised to H level at select level by column decoder 7 to cause a column select gate 4 of the column to be conductive and to thereby connect one memory cell 1 activated to write circuit 8 through bit line pair BL and /BL, and data input/output line pair IO and /IO.

Write circuit 8 not only drives one data input/output line of data input/output lines IO and /IO to H level according to data signal DI given externally, but also drives the other input/output line to L level to write data onto memory cell 1. When word line WL and column select line CSL are lowered to L level, data is stored into memory cell 1.

In read operation, column select line CSL of a column designated by a column address signal is raised to H level at select level to cause column select gate 4 of the column to be conductive and to thereby connect bit line pair BL and /BL to read circuit 9 through data input/output line pair IO and /IO. Then, bit line equalize signal /BLEQ is driven to L level at activation level to cause equalizers 3 to be conductive and to thereby equalize potentials on bit line pairs BL and /BL with each other. After bit line equalize signal /BLEQ is driven to H level at deactivation level and to thereby cause equalizers 3 to be non-conductive, word line WL of a row corresponding to a row address signal is raised to H level at select level by row decoder 5 to activate memory cells 1 on the row. Thereby, a current flows into memory cell from one bit line of bit lines BL and /BL according to data stored in memory cell 1 to, in response, lower a potential on one data input/output line of data input/output lines IO and /IO. Read circuit 9 compares potentials on data input/output lines IO and /IO with each other to output a data signal DO at a logic level corresponding to a result of the comparison to outside.

Figure 2:
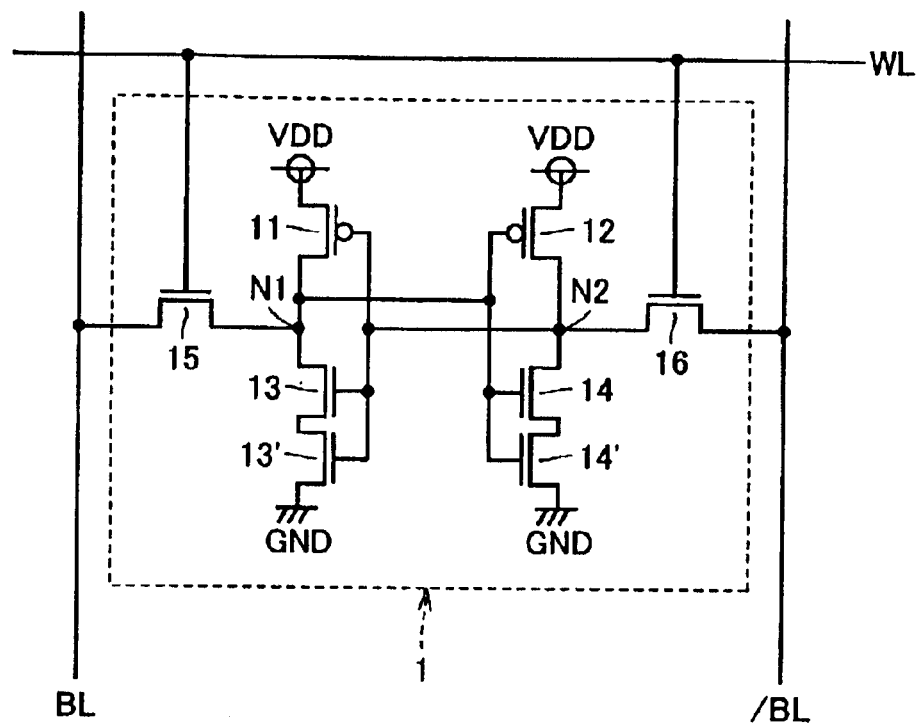
FIG. 2 is a circuit diagram showing a configuration of a memory cell shown in FIG. 1.

FIG. 2 is a circuit diagram showing a configuration of memory cell 1. In FIG. 2, memory cell 1 includes: P-channel MOS transistors 11 and 12; N-channel MOS transistors 13 and 13', 14 and 14', 15 and 16; and storage nodes N1 and N2. P-channel MOS transistor 11 is connected between a line of power supply potential VDD and storage node N1, and P-channel MOS transistor 12 is connected between a line of power supply potential VDD and storage node N2 and the gates thereof are connected to respective storage nodes N2 and N1. N-channel MOS transistors 13 and 13' are connected in series between storage node N1 and a line of ground potential GND and the gates thereof are both connected to storage node N2. N-channel MOS transistors 14 and 14' are connected in series between storage node N2 and a line of ground potential GND and the gates thereof are both connected to storage node N1. MOS transistors 11, 13 and 13' constitute an inverter giving an inverted signal of a signal occurring on storage node N2 to storage node N1. MOS transistors 12, 14 and 14' constitute an inverter giving an inverted signal of a signal occurring on storage node N1 to storage node N2. The two inverters are antiparallel-connected between storage nodes N1 and N2 to constitute a latch circuit. N-channel MOS transistor 15 is connected between storage node N1 and bit line BL and the gate thereof is connected to word line WL. N-channel MOS transistor 16 is connected between storage node N2 and bit line /BL and the gate thereof is connected to word line WL.

Then, description will be given of operation of memory cell 1. In write operation, word line WL is driven to H level to cause N-channel MOS transistors 15 and 16 to be conductive and to thereby couple bit lines BL and /BL to respective storage nodes N1 and N2. Then, according to write data signal DI, not only is one bit line (for example, BL) of bit lines BL and /BL driven to H level, but the other bit line (/BL in this case) is also driven to L level. Thereby, not only do MOS transistors 11, 14 and 14' become conductive, but MOS transistors 12, 13 and 13' also become non-conductive to latch storage nodes N1 and N2 at H and L levels, respectively. When word line WL is driven to L level, N-channel MOS transistors 15 and 16 become non-conductive to end write of the data signal.

In read operation, word line WL is driven to H level to cause N-channel MOS transistors 15 and 16 to be conductive and to thereby couple bit lines BL and /BL to respective storage nodes N1 and N2. Thereby, a current flows onto the line of ground potential GND from a bit line (BL in this case) coupled to the node (for example, N1) held at L level of storage nodes N1 and N2 through N-channel MOS transistors 15, 13 and 13' to lower bit line BL to L level. Then, potentials on bit lines BL and /BL are compared with each other to output data signal DO at a level corresponding to a result of the comparison.

In the first embodiment, not only are two N-channel MOS transistors 13 and 13' connected in series between storage node N1 and the line of ground potential GND, but two N-channel MOS transistors 14 and 14' are also connected in series between storage node N2 and the line of ground potential GND. Therefore, since capacities of storage nodes N1 and N2 can be larger compared with a prior art practice, it can be prevented from occurring that logic levels of storage nodes N1 and N2 are inverted by electrons generated by α-particle radiation. Furthermore, in a case where memory cell 1 is formed on an SOI substrate, unless one α-particle passes through body regions of two N-channel MOS transistors (for example, 13 and 13') in a non-conductive state, stored data is not inverted; therefore, the storage data can be harder to be inverted compared with a practical case where if one α-particle passed through one N-channel MOS transistor (for example, 83) storage data was inverted, thereby, enabling improvement on soft error resistance.

Figure 3:
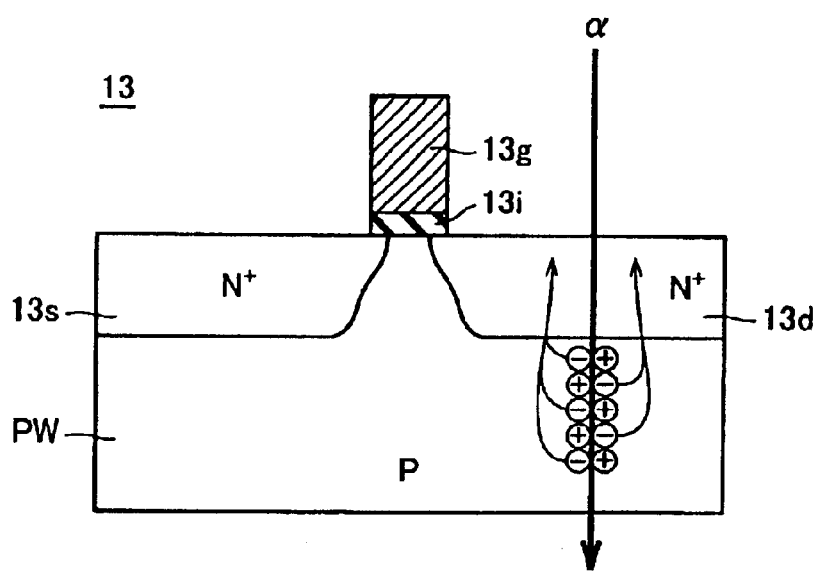
FIG. 3 is a view for describing an effect of the first embodiment.

Here, detailed description will be given of a reason why soft error resistance is improved by connecting two N-channel MOS transistors in series between a storage node and a line of ground potential GND. FIG. 3 is a sectional view showing N-channel MOS transistor 13 formed on a bulk silicon substrate. In FIG. 3, N-channel MOS transistor 13 has a structure in which a gate electrode 13g is formed on a surface of a P-type well PW with a gate insulating film 13i interposing therebetween and N$^+$-type diffusion layers are formed on both sides of gate electrode 13g. The N$^+$-type diffusion layer on one side of gate electrode 13g serves as a drain region 13d, while the N$^+$-type diffusion region on the other side of gate electrode 13g serves as a source region 13s.

An α-particle is identical with a nucleus of the helium (He$^{++}$) atom; a positively charged bivalent particle and emitted during radioactive decay of a uranium-238 nucleus and a thorium-232 nucleus, present in a trace amount in the natural world. Since such uranium and thorium are included in a package for a chip, aluminum interconnects, a silicide electrode, a lead solder bump and others, α-particles are emitted from them. When α-particle radiation strikes drain region 13d of N-channel MOS transistor 13, many electron-hole pairs are generated in P-type well PW below drain region 13d and many electrons thereof flow into drain region 13d. Therefore, when a capacity of storage node N1 is small, a logic level of storage node N1 is inverted from H level to L level by electrons flowing into drain region 13d. However, in the first embodiment, since two N-channel MOS transistors 14 and 14' are connected in series to increase the capacity of storage node N1, it can be prevented from occurring that a logic level of storage node N1 is inverted.

Figure 4A:
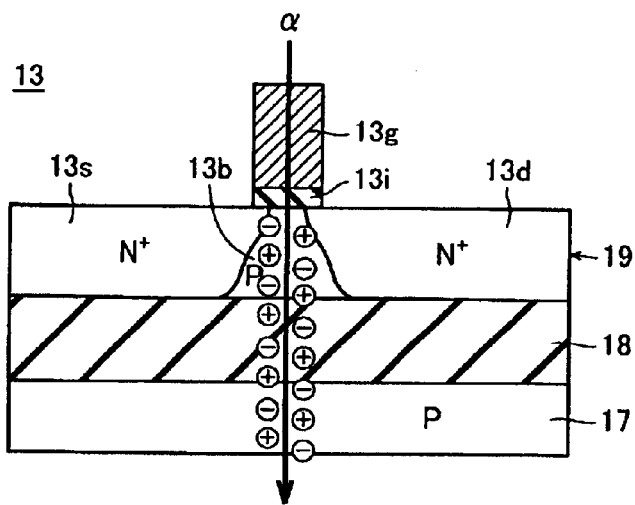
FIGS. 4A to 4C are views and a representation for describing the effect of the first embodiment.
Figure 4B:
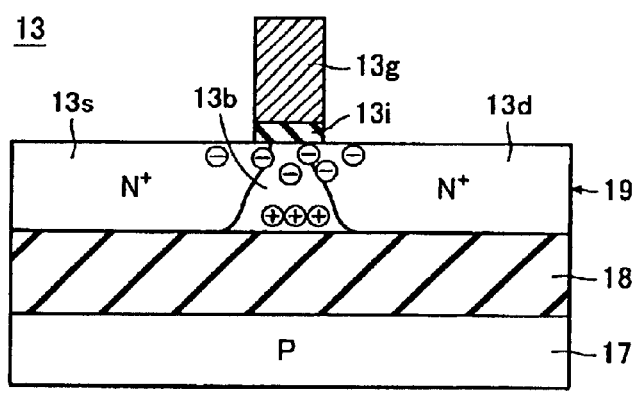
Figure 4C:
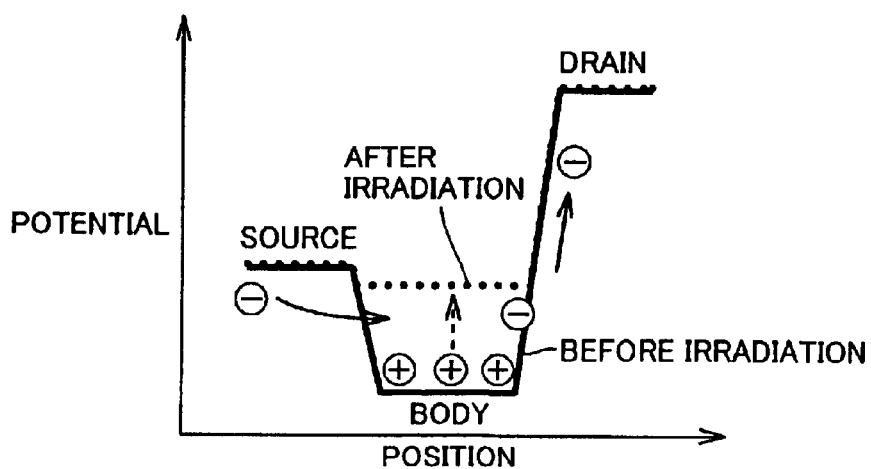

FIGS. 4A to 4C are views showing states where N-channel MOS transistor 13 formed on an SOI substrate is irradiated with α-particle radiation. In FIGS. 4A to 4C, the SOI substrate has a structure in which a buried oxide film 18 is formed on a surface of a P-type silicon substrate 17 and a P-type silicon layer 19 is formed on buried oxide film 18. N-channel MOS transistor 13 has a structure in which gate electrode 13g is formed on a surface of P-type silicon layer 19 with gate insulating film 13i interposing therebetween and N$^+$-type diffusion layers are formed on both sides of gate electrode 13g. The N$^+$-type diffusion layer on one side of gate electrode 13g serves as drain region 13d, while the N$^+$-type diffusion layer on the other side of gate electrode 13g serves as source region 13s. P-type layer 19 below gate electrode 13g is called body region 13b.

In a case where N-channel MOS transistor 13 is formed on a bulk silicon substrate, irradiation of drain region 13d with α-particle radiation is problematic as described above, whereas in a case where N-channel MOS transistor 13 is formed on the SOI substrate, irradiation of drain region 13d with α-particle radiation is not problematic since a portion below drain region 13d is shielded by buried oxide film 18 covering P-type substrate. It is when α-particle radiation strikes body region 13b that a problem arises in a case where N-channel MOS transistor 13 is formed on the SOI substrate.

FIG. 4A shows a case where α-particle radiation strikes body region 13b from above N-channel MOS transistor 13. As shown in FIG. 4A, many electron-hole pairs are generated along a path of an α-particle. Electron-hole pairs generated in P-type silicon substrate 17 have no chance to be collected into P-type silicon layer 19 thereabove since P-type silicon substrate 17 and P-type silicon layer 19 are insulated from each other by buried oxide film 18. Of electron-hole pairs generated in body region 13b, electrons are immediately collected in drain region 13d by a voltage applied to drain region 13d. On the other hand, holes are, as shown in FIG. 4B, accumulated in a lower portion of body region 13b. As shown in FIG. 14C, since a body potential is raised by the accumulated holes, a potential barrier is lowered between the body region and the source region to thereby cause electrons to flow into the drain region from the source. Such a phenomenon, which is unique to an SOI device, is called a parasitic bipolar effect.

Therefore, when body region 13b is irradiated with α-particle radiation, N-channel MOS transistor 13 becomes conductive. However, since a probability that one α-particle passes through body regions 13b and 13'b of N-channel MOS transistors 13 and 13' is very low, soft error resistance of memory cell 1 of FIG. 2 is greatly improved compared with a prior art practice.

Second Embodiment

Figure 5B:
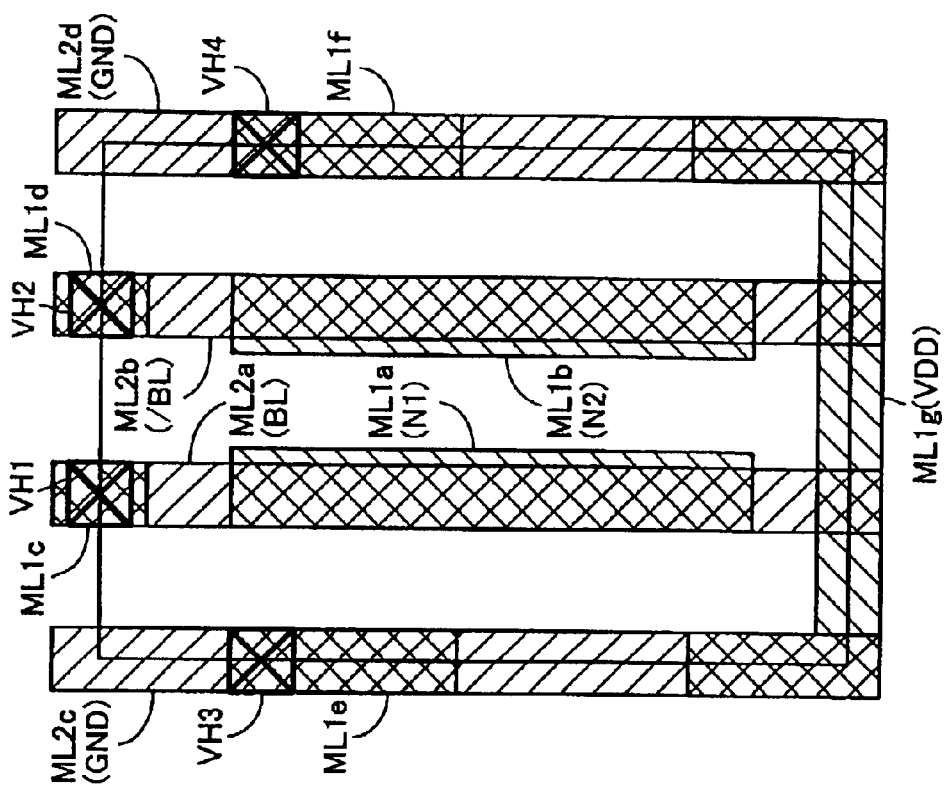
FIGS. 5A and 5B are plan views showing a layout of a memory cell of SRAM according to a second embodiment of the present invention.
Figure 5A:
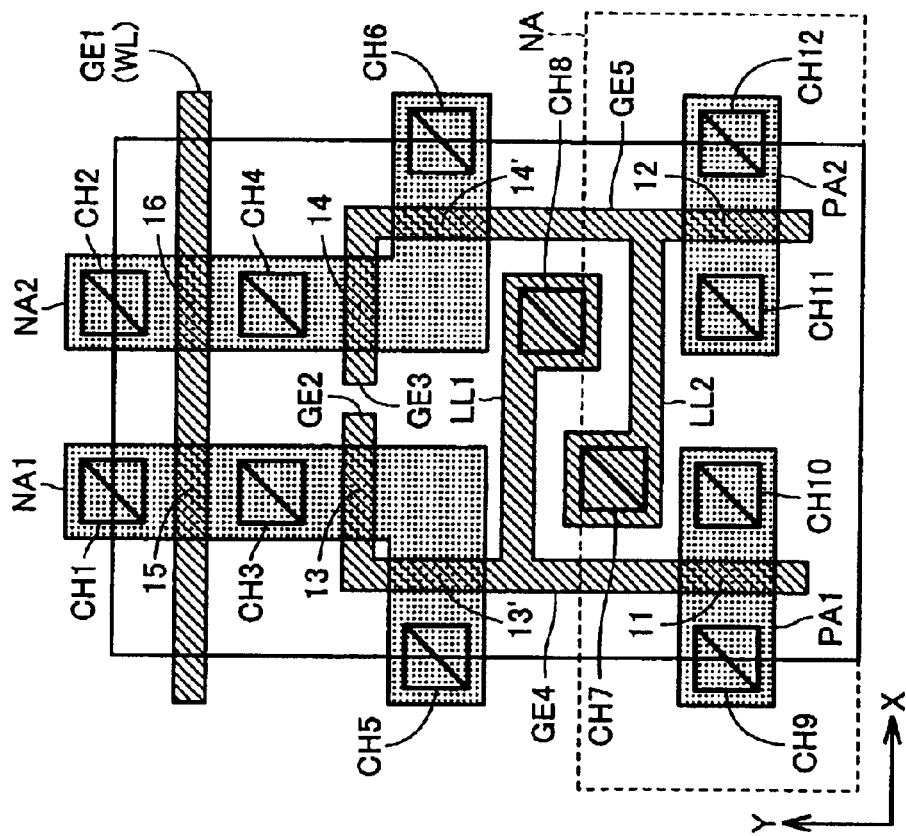

FIGS. 5A and 5B show a layout of a memory cell of SRAM according to a second embodiment of the present invention. The memory cell has the same configuration as memory cell 1 of FIG. 2, including P-channel MOS transistors 11 and 12; and N-channel MOS transistors 13, 13', 14, 14', 15 and 16. The memory cell is formed on an SOI substrate.

First of all, as shown in FIG. 5A, an N-type active layer NA is formed on part of a P-type region of the SOI substrate. Next, there are formed gate electrodes GE1 to GE3 extending in the X direction of the figure on a surface of P-type silicon layer; gate electrodes GE4 and GE5 extending in the Y direction of the figure from the surface of P-type silicon layer over to the surface of N-type active layer NA; a local interconnect LL1 extending in the X direction of the figure on the surface of P-type silicon surface; and a local interconnect LL2 extending in the X direction of the figure on the surface of N-type active layer NA.

Gate electrode GE1 constitutes a word line WL. Gate electrodes GE2 and GE3 are placed on a straight line in parallel to gate electrode GE1 in a region between gate electrode GE1 and N-type active layer NA. Gate electrode GE4 is coupled to one end portion of gate electrode GE2 at a right angle thereto. Gate electrode GE5 is coupled to one end portion of gate electrode GE3 at a right angle thereto. The other ends of gate electrodes GE2 and GE3 are placed facing each other. One end portion of local interconnect LL1 is coupled to the middle portion of gate electrode GE4 and the other end portion thereof extends near gate electrode GE5. One end portion of local interconnect LL2 is coupled to the middle portion of gate electrode GE5 and the other end thereof extends near gate electrode GE4.

Then, on the P-type silicon layer, not only is an N-type active layer NA1 of the shape of a L letter formed so as to traverse gate electrodes GE1, GE2 and GE4, but an N-type active layer NA2 of the shape of a L letter is also formed so as to traverse gate electrodes GE1, GE3 and GE5. Furthermore, on N-type active layer NA, not only is a P-type active layer PA1 formed so as to traverse gate electrode GE4, but a P-type active layer PA2 is also formed so as to traverse gate electrode GE5.

N-type active layer NA1 and gate electrode GE1, and N-type active layer NA2 and gate electrode GE1 constitute respective N-channel MOS transistors 15 and 16. N-type active layer NA1 and gate electrode GE2, and N-type active layer NA2 and gate electrode GE3 constitute respective N-channel MOS transistors 13 and 14. N-type active layer NA1 and gate electrode GE4, and N-type active layer NA2 and gate electrode GE5 constitute respective N-channel MOS transistors 13' and 14'. P-type active layer PA1 and gate electrode GE4, and P-type active layer PA2 and gate electrode GE5 constitute respective P-channel MOS transistors 11 and 12.

Then, as shown in FIG. 5B, metal interconnects ML1a to ML1g are formed using a first metal interconnection layer and furthermore, metal interconnects ML2a to ML2d extending in the Y direction of the figure are formed using a second metal interconnection layer. Metal interconnects ML1a and ML1b constitute parts of respective storage nodes N1 and N2. Each of metal interconnects ML1c to ML1f are used as a connection electrode. Power supply potential VDD is given onto metal interconnect ML1a. Metal interconnects ML2a and ML2b constitute respective bit lines BL and /BL. Ground potential GND is given to metal interconnects ML2c and ML2d.

One end portion of N-type active layer NA1 (the drain of N-channel MOS transistor 15) is connected to metal interconnect ML2a (bit line BL) through a contact hole CH1, metal interconnect ML1c and a via hole VH1. One end portion of N-type active layer NA2 (the drain of N-channel MOS transistor 16) is connected to metal interconnect ML2b (bit line /BL) through a contact hole CH2, metal interconnect ML1d and a via hole VH2.

A region (the drain of N-channel MOS transistor 13 and the source of N-channel MOS transistor 15) between gate electrodes GE1 and GE2 on N-type active layer NA1 is connected to metal interconnect ML1a (storage node N1) through contact hole CH3, the other end portion of local interconnect LL2 is connected to metal interconnect ML1a (storage node N1) through a contact hole CH7 and one end portion of P-type active layer PA1 (the drain of P-channel MOS transistor 11) is connected to metal interconnect ML1a (storage node N1) through contact hole CH10.

A region (the drain of N-channel MOS transistor 14 and the source of N-channel MOS transistor 16) between gate electrodes GE1 and GE3 on N-type active layer NA2 is connected to metal interconnect ML1b (storage node N2) through a contact hole CH4, the other end portion of local interconnect LL1 is connected to metal interconnect ML1b (storage node N2) through a contact hole CH8 and one end portion of P-type active layer PA2 (the drain of P-channel MOS transistor 12) is connected to metal interconnect ML1b (storage node N2) through contact hole CH11.

The other end portion of N-type active layer NA1 is connected to metal interconnect ML2c (a line of ground potential GND) through contact hole CH5, metal interconnect ML1e and via hole VH3. The other end portion of N-type active layer NA2 is connected to metal interconnect ML2d (a line of ground potential GND) through a contact hole CH6, metal interconnect ML1f and via hole VH4. The other end portion of P-type active layers PA1 is connected to metal interconnect ML1g (a line of power supply potential VDD) through a contact hole CH9, and the other end portion of P-type active layers PA2 is connected to metal interconnect ML1g (a line of power supply potential VDD) through a contact hole CH12. In such a manner, the memory cell is constructed.

In the second embodiment, not only are gate electrodes GE2 and GE4 of N-channel MOS transistors 13 and 13' placed so as to intersect with each other at a right angle, but gate electrodes GE3 and GE5 of N-channel MOS transistors 14 and 14' are also placed so as to intersect with each other at a right angle. In order to invert hold data in storage node N1 and N2, it is required that one α-particle passes through the body regions of N-channel MOS transistors 13 and 13' or one α-particle passes through the body regions of N-channel MOS transistors 14 and 14'. In order to produce such a situation associated with an α-particle, while it is necessary that an α-particle flies in a direction at an angle of 45 degrees to the X direction in a horizontal plane including the body regions of N-channel MOS transistors 13, 13', 14 and 14' to strike the body region of N-channel MOS transistor 13, 13', 14 or 14', a probability of such a collision of an α-particle is extremely lower compared with a probability that an α-particle flies in any direction to strike one N-channel MOS transistor 83 or 84. Therefore, it can be prevented from occurring that hold data in storage nodes N1 and N2 is inverted, thereby enabling improvement on soft error resistance. Note that since a probability that two or more α-particles strike N-channel MOS transistors 13 and 13' or 14 and 14' simultaneously is very low, the probability is outside a necessity for consideration to be given. Furthermore, since the memory cell can be constituted of two metal interconnection layers, reduction in fabrication cost can be realized.

Third Embodiment

Figure 6B:
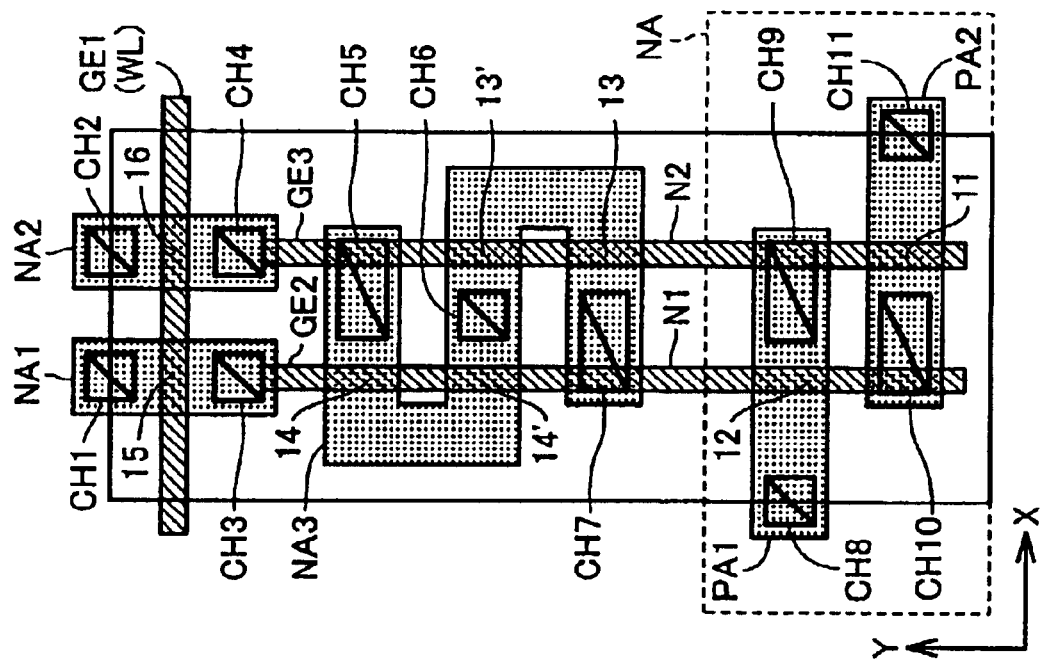
FIGS. 6A and 6B are plan views showing a layout of a memory cell of SRAM according to a third embodiment of the present invention.
Figure 6A:
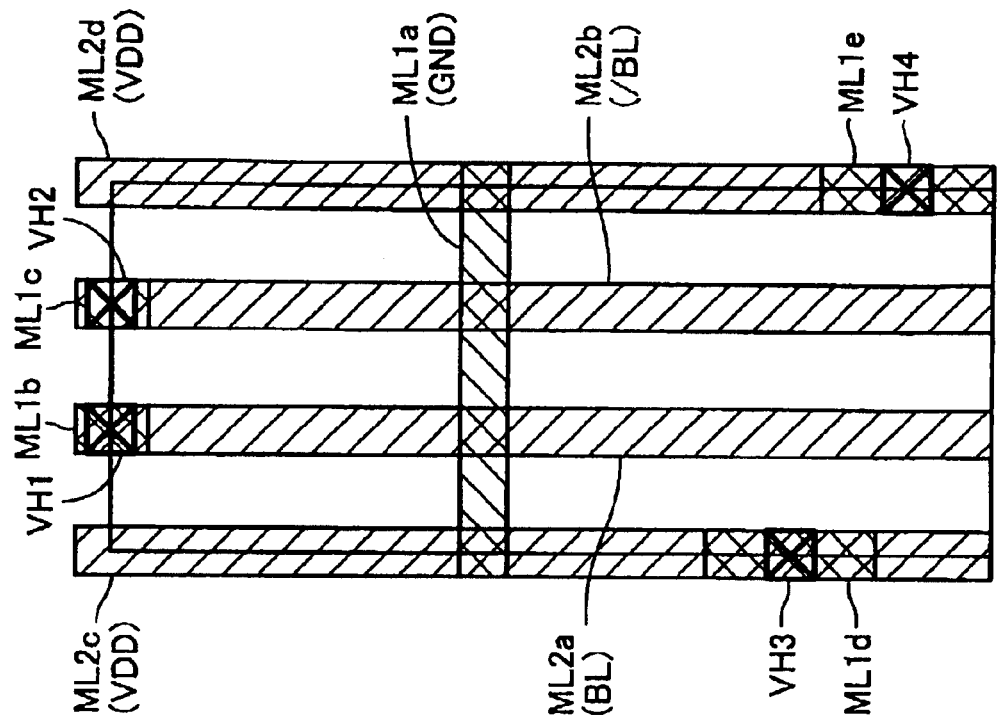

FIGS. 6A and 6B show a layout of a memory cell of SRAM according to a third embodiment of the present invention. The memory cell has the same configuration as memory cell 1 of FIG. 2, including P-channel MOS transistors 11 and 12; and N-channel MOS transistors 13, 13', 14, 14', 15 and 16. The memory cell is formed on an SOI substrate.

First of all, as shown in FIG. 6A, N-type active layer NA is formed on part of a P-type silicon layer of the SOI substrate. Then, there are formed gate electrode GE1 extending in the X direction of the figure on a surface of the P-type silicon layer and gate electrodes GE2 and GE3 extending in the Y direction of the figure from the surface of the P-type silicon layer over to N-type active layer NA. Gate electrode GE1 constitutes a word line WL. One end portions of gate electrodes GE2 and GE3 are placed facing one side of electrode GE1.

Then, on the P-type silicon layer, not only is N-type active layer NA1 formed from the one end portion of gate electrode GE2 over to the other side of gate electrode GE1, but N-type active layer NA2 is also formed from the one end portion of gate electrode GE3 over to the other side of gate electrode GE1. Furthermore, on the P-type silicon layer, an N-type active layer NA3 of the shape of a letter S is formed so as to traverse gate electrodes GE3 and GE2 from one side of gate electrode GE3, then traverse gate electrodes GE2 and GE3, and furthermore traverse gate electrodes GE3 and GE2. Moreover, on N-type active layer NA, two P-type active layers PA1 and PA3 are formed so as to traverse gate electrodes GE2 and GE3.

N-type active layer NA1 and gate electrode GE1, and N-type active layer NA2 and gate electrode GE1 constitute respective N-channel MOS transistors 15 and 16. N-type active layer NA3 and gate electrode GE2 constitute N-channel MOS transistors 14 and 14'. N-type active layer NA3 and gate electrode GE3 constitute N-channel MOS transistors 13 and 13'. P-type active layer PA1 and gate electrode GE2 constitute P-channel MOS transistor 12. P-type active layer PA2 and gate electrode GE3 constitute P-channel MOS transistor 11.

Then, as shown in FIG. 6B, metal interconnects ML1a to ML1e are formed using a first metal interconnection layer and moreover, metal interconnects ML2a to ML2d extending in the Y direction of the figure are formed using a second metal interconnection layer. Ground potential GND is given onto metal interconnect ML1a. Each of metal interconnects ML1b to ML1e are used as a connection electrode. Metal interconnects ML2a and ML2b constitute respective bit lines BL and /BL. Power supply potential VDD is given to metal interconnects ML2c and ML2d.

One end portion of N-type active layer NA1 (the drain of N-channel MOS transistor 15) is connected to metal interconnect ML2a (bit line BL) through contact hole CH1, metal interconnect ML1b and via hole VH1. One end portion of N-type active layer NA2 (the drain of N-channel MOS transistor 16) is connected to metal interconnect ML2b (bit line /BL) through contact hole CH2, metal interconnect ML1c and via hole VH2. The middle portion of N-type active layer NA3 (the sources of N-channel MOS transistors 13' and 14') is connected to metal interconnect ML1a (a line of ground potential GND) through contact hole CH6.

One end portion of P-type active layer PA1 (the source of P-channel MOS transistor 12) is connected to metal interconnect ML2c (a line of power supply potential VDD) through contact hole CH8, metal interconnect ML1d and via hole VH3. One end portion of P-type active layer PA2 (the source of P-channel MOS transistor 11) is connected to metal interconnect ML2d (a line of power supply potential VDD) through contact hole CH11, metal interconnect ML1e and via hole VH4.

The other end portion of N-type active layer NA1 (the source of N-channel MOS transistor 15) and one end of gate electrode GE2 are connected to each other through a plug layer in contact hole CH3, the other end portion of N-type active layer NA2 (the source of N-channel MOS transistor 16) and one end portion of gate electrode GE3 through a plug layer in contact hole CH4, one end portion of N-type active layer NA3 (the drain of N-channel MOS transistor 14) and gate electrode GE3 through a plug layer in contact hole CH5, the other end portion of N-type active layer NA3 (the drain of N-channel MOS transistor 13) and gate electrode GE2 through a plug layer in contact hole CH7, the other end portion of P-type active layer PA1 (the drain of P-channel MOS transistor 12) and gate electrode GE3 through a plug layer in contact hole CH9, and the other end portion of P-type active layer PA2 (the drain of P-channel MOS transistor 11) and gate electrode GE2 through a plug layer in contact hole CH10.

In the third embodiment, not only is gate electrode GE3 of N-channel MOS transistors 13 and 13' placed on a straight line, but gate electrode GE2 of N-channel MOS transistors 14 and 14' is also placed on a straight line. Therefore, in order to invert storage data in storage nodes N1 and N2, while it is required that an α-particle flies in the Y direction in a horizontal plane including the body regions of N-channel MOS transistors 13, 13', 14 and 14', and in addition strikes the body region of N-channel MOS transistor 13, 13', 14 or 14', a probability of such collision is lower than in a case where in the second embodiment, an α-particle strikes the body regions of N-channel MOS transistors 13 and 13' or 14 and 14' since widths of gate electrodes GE2 and GE3 are narrower than a width of N-type active layer NA3. Therefore, it can be prevented from occurring that hold data in storage nodes N1 and N2 is inverted, thereby enabling improvement on soft error resistance. Furthermore, since the storage nodes can be constituted with a two metal interconnection layer, reduction in fabrication cost can be realized.

Fourth Embodiment

Figure 7A:
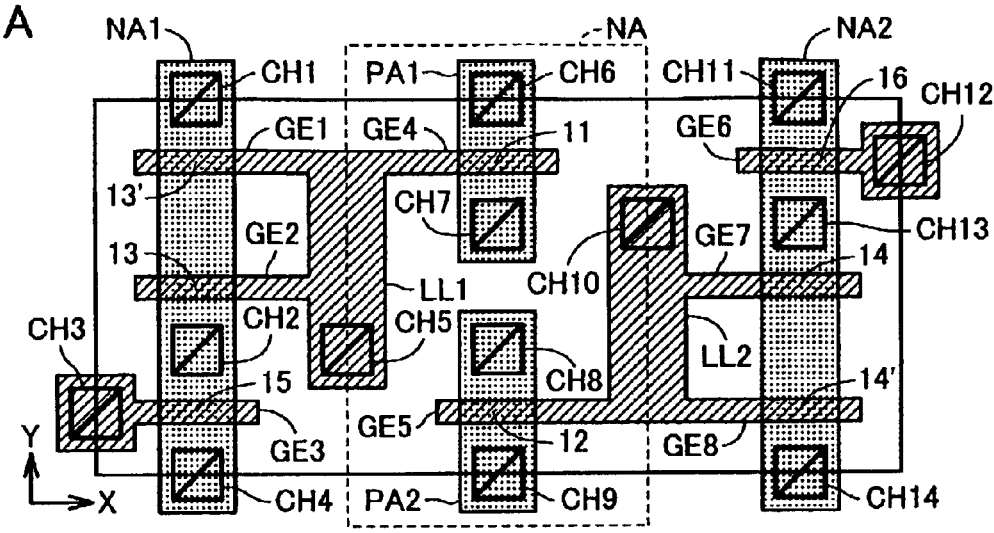
FIGS. 7A, 7B and 7C are plan views showing a layout of a memory cell of SRAM according to a fourth embodiment of the present invention.
Figure 7B:
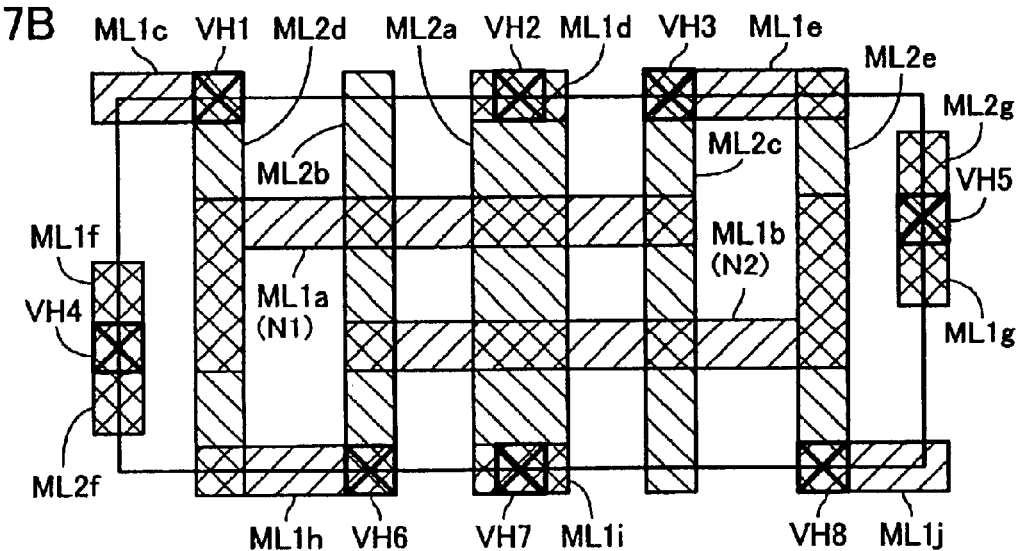
Figure 7C:
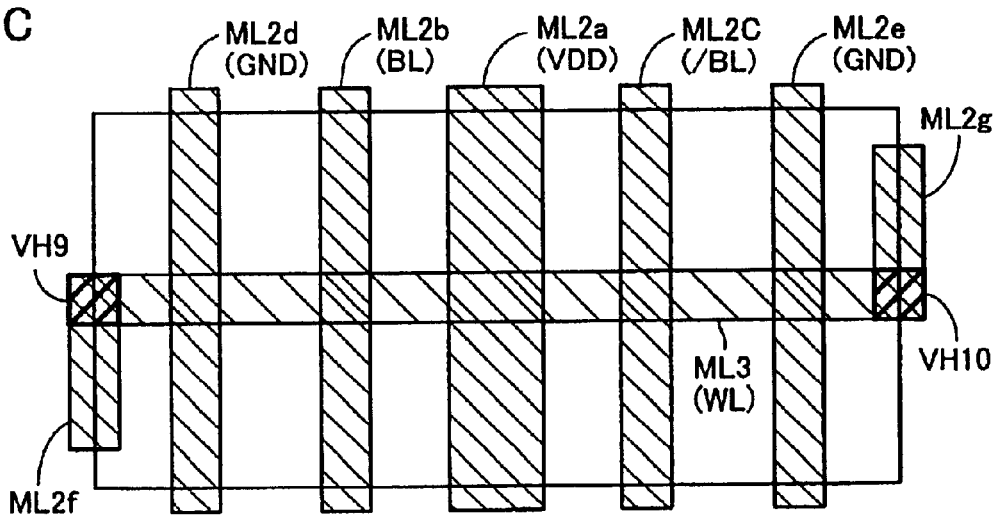

FIGS. 7A, 7B and 7C are plan views showing a layout of a memory cell of SRAM according to a fourth embodiment of the present invention. The memory cell has the same configuration as memory cell 1 of FIG. 2, including P-channel MOS transistors 11 and 12; and N-channel MOS transistors 13, 13', 14, 14' 15 and 16. The memory cell is formed on an SOI substrate.

First of all, as shown in FIG. 7A, N-type active layer NA is formed on part of a P-type silicon layer of the SOI substrate. Then, there are formed 3 gate electrodes GE1 to GE 3 extending in the X direction of the figure on a surface of the P-type silicon layer on one side of N-type active layer NA; 2 gate electrodes GE4 and GE5 extending in the X direction of the figure on a surface of N-type active layer NA; gate electrodes GE6 to GE8 extending in the X direction of the figure on a surface of P-type active layer on the other side of N-type active layer NA; local interconnect LL1 extending in the Y direction of the figure along the boundary portion between N-type active layer NA and a P-type silicon layer on the one side thereof; and local interconnect LL2 extending in the Y direction of the figure along the boundary portion between N-type active layer NA and a P-type silicon layer on the other side thereof.

Each set of Gate electrodes GE1, GE2 and GE3; GE4 and GE5; and GE6, GE7 and GE8 is placed such that the electrodes are in parallel to each other. Each set of gate electrodes GE1, GE4 and GE6; GE2 and GE7; and GE3, GE5 and GE8 is placed such that the electrodes are on a straight line. Each of gate electrodes GE1, GE2 and GE4, and local line LL1 is mutually connected therebetween. Each of gate electrodes GE5, GE7 and GE8, and local line LL2 is mutually connected therebetween.

Then, on the P-type silicon layer, not only is N-type active layer NA1 formed so as to traverse gate electrodes GE1 to GE3, but N-type active layer NA2 is also formed so as to traverse gate electrodes GE6 to GE8. Furthermore, on N-type active layer NA, P-type active layers PA1 and PA2 are formed so as to traverse gate electrodes GE4 and GE5.

N-type active layer NA1 and gate electrode GE1 constitute N-channel MOS transistor 13', N-type active layer NA1 and gate electrode GE2 constitute N-channel MOS transistor 13 and N-type active layer NA1 and gate electrode GE3 constitute N-channel MOS transistor 15. N-type active layer NA2 and gate electrode GE6 constitute N-channel MOS transistor 16, N-type active layer NA2 and gate electrode GE7 constitute N-channel MOS transistor 14 and N-type active layer NA2 and gate electrode GE8 constitute N-channel MOS transistor 14'. P-type active layer PA1 and gate electrode GE4 constitute P-channel MOS transistor 11. P-type active layer PA2 and gate electrode GE5 constitute P-channel MOS transistor 12.

Then, as shown in FIGS. 7B and 7C, metal interconnects ML1a to ML1j are formed using a first metal interconnection layer, then, metal interconnects ML2a to ML2g are formed using a second metal interconnection layer and furthermore, metal interconnect ML3 is formed using a third metal interconnection layer. Metal interconnects ML1a and ML1b constitute parts of respective storage nodes N1 and N2. Each of metal interconnects ML1c to ML1j are used as a connection electrode. Power supply potential VDD is given to metal interconnect ML2a and ground potential GND is given to metal interconnects ML2d and ML2e. Metal interconnects ML2b and ML2c constitutes respective bit lines BL and /BL. Metal interconnect ML3 constitutes word line WL.

One end portion of N-type active layer NA1 (the source of N-channel MOS transistor 13') is connected to metal interconnect ML2d (a line of ground potential GND) through contact hole CH1, metal interconnect ML1c and via hole VH1. One end portion of N-type active layer NA2 (the source of N-channel MOS transistor 14') is connected to metal interconnect ML2e (a line of ground potential GND) through contact hole CH14, metal interconnect ML1j and via hole VH8.

A region (the drain of N-channel MOS transistor 13 and the source of N-channel MOS transistor 15) between gate electrodes GE6 and GE7 of N-type active layer NA1 is connected to metal interconnect ML1a through contact hole CH2, one end portion of P-type active layer PA1 is connected to metal interconnect ML1a through contact hole CH7 and local interconnect LL2 is connected to metal interconnect ML1a through contact hole CH10. A region (the drain of N-channel MOS transistor 14 and the source of N-channel MOS transistor 16) between gate electrodes GE6 and GE7 of N-type active layer NA2 is connected to metal interconnect ML1b through contact hole CH13, one end portion of P-type active layer PA2 is connected to metal interconnect ML1b through contact holes CH8 and local interconnect LL1 is connected to metal interconnect ML1b through contact hole CH5.

Gate electrode GE3 is connected to metal interconnect ML3 (word line WL) through contact hole CH3, metal interconnect ML1f, via hole VH4, metal interconnect ML2f and vial hole VH9. Gate electrode GE6 is connected to metal interconnect ML3 (word line WL) through contact hole CH12, metal interconnect ML1g, via hole VH5, metal interconnect ML2g and vial hole VH10.

The other end portion of N-type active layer NA1 is connected to metal interconnect ML2b (bit line BL) through contact hole CH4, metal interconnect ML1h and via hole VH6. The other end portion of N-type active layer NA2 is connected to metal interconnect ML2c (bit line/BL) through contact hole CH11, metal interconnect ML1e and via hole VH3.

In the fourth embodiment, N-type active layer NA is placed in the middle, not only are N-channel MOS transistors 13 and 13' formed on the one side thereof, but N-channel MOS transistors 14 and 14' are also formed on the other side, and not only word line WL is formed in the X direction, but bit lines BL and /BL are also formed in the Y direction. Therefore, a shape of the memory cell can be long from side to side, thereby enabling bit lines BL and /BL shorter in length. Accordingly, improvements can be achieved on a speed in a read/write operation and reduction in power consumption since capacities of bit lines BL and /BL and values of interconnect resistance thereof can be smaller.

Furthermore, directions of the gate electrodes of all transistors 11 to 13, 13', 14, 14', 15 and 16 are the same as each other, fluctuations in characteristic caused by fluctuations in parameters in fabrication such as misalignment of a mask can be restricted to low levels and furthermore easy control of a finish size of a gate length can be realized.

Furthermore, not only is N-type active layer NA1 of N-channel MOS transistors 13 and 13' placed on a straight line, but N-type active layer NA2 of N-channel MOS transistors 14 and 14' is also placed on a straight line. Therefore, in order to invert hold data in storage nodes N1 and N2, while it is required that an α-particle flies in the Y direction in a horizontal plane including the body regions of N-channel MOS transistors 13, 13', 14 and 14' and in addition strikes body regions of N-channel MOS transistors 13 and 13', 14 or 14', a probability of such a collision is very low. Accordingly, it can be prevented from occurring that hold data in storage nodes N1 and N2 is inverted, thereby enabling improvement on soft error resistance.

Fifth Embodiment

Figure 8:
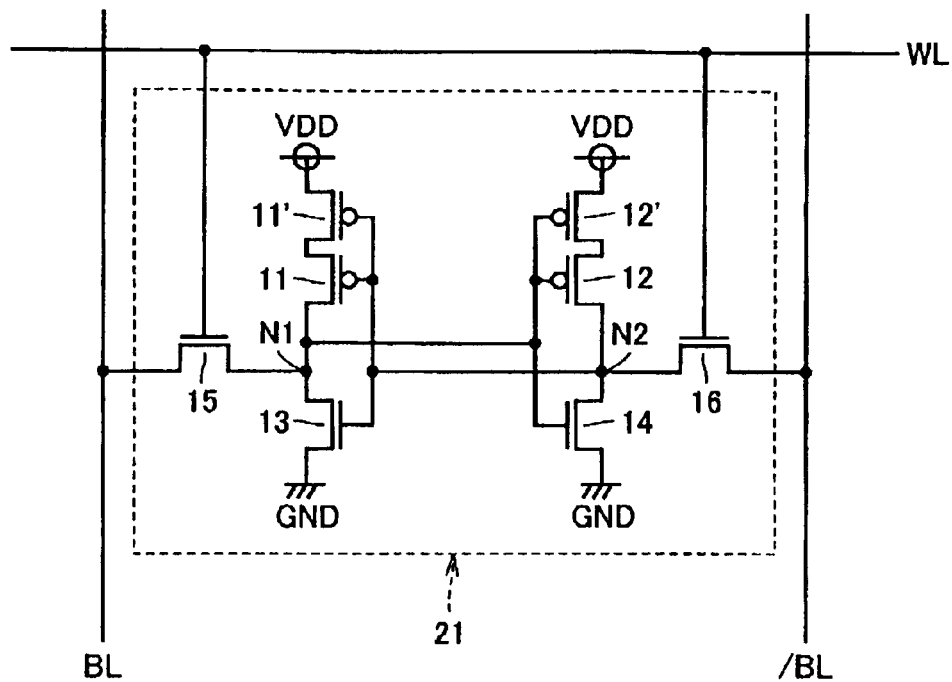
FIG. 8 is a circuit diagram showing a configuration of a memory cell of SRAM according to a fifth embodiment of the present invention.

FIG. 8 is a circuit diagram showing a configuration of a memory cell 21 of SRAM according to a fifth embodiment of the present invention. In FIG. 8, an aspect in which the memory cell 21 is different from memory cell 1 of FIG. 2 is that N-channel MOS transistors 13' and 14' are deleted therefrom, but P-channel MOS transistors 11' and 12' are added thereto.

P-channel MOS transistors 11' and 11 are connected in series between a line of power supply potential VDD and storage node N1 and the gates thereof are connected to storage node N2. P-channel MOS transistors 12' and 12 are connected in series between a line of power supply potential VDD and storage node N2 and the gates thereof are connected to storage node N1. N-channel MOS transistor 13 is connected between a line of ground potential GND and storage node N1 and the gate thereof is connected to storage node N2. N-channel MOS transistor 14 is connected between a line of ground potential GND and storage node N2 and the gate thereof is connected to storage node N1.

N-channel MOS transistors 11, 11' and 13 constitute an inverter giving an inverted signal of a signal held in storage node N2 to storage node N1. N-channel MOS transistors 12, 12' and 14 constitute an inverter giving an inverted signal of a signal held in storage node N1 to storage node N2. The other parts of the configuration and operation are the same as corresponding parts of the configuration and operation of memory cell 1 of FIG. 2; therefore none of descriptions thereof is repeated.

In the fifth embodiment, not only are P-channel MOS transistors 11 and 11' connected in series between storage node N1 and the line of power supply potential VDD, but two P-channel MOS transistors 12 and 12' are also connected in series between storage node N2 and the line of power supply potential VDD. Accordingly, since capacities of storage nodes N1 and N2 can be larger compared with a prior art practice, it can be prevented from occurring that logic levels of storage nodes N1 and N2 are inverted by electrons generated by α-particle radiation. Furthermore, in a case where memory cell 21 is formed on an SOI substrate, unless one α-particle passes through the body regions of two P-channel MOS transistors (for example, 11 and 11') in a non-conductive state, storage data is not inverted, therefore, the storage data can be harder to be inverted compared with a prior art case where if one α-particle passed through one P-channel MOS transistor (for example, 81), storage data was inverted, thereby enabling improvement on soft error resistance.

Sixth Embodiment

Figure 9:
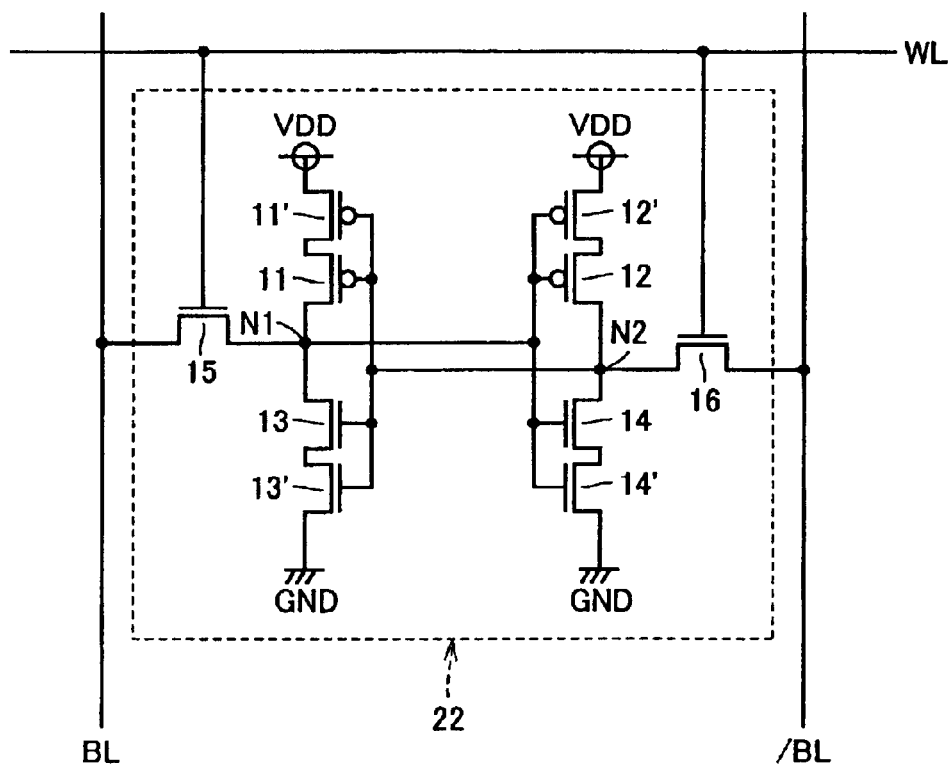
FIG. 9 is a circuit diagram showing a configuration of a memory cell of SRAM according to a sixth embodiment of the present invention.

FIG. 9 is a circuit diagram showing a configuration of a memory cell 22 of SRAM according to a sixth embodiment of the present invention. In FIG. 9, an aspect in which memory cell 22 is different from memory cell 1 of FIG. 2 is that P-channel MOS transistors 11' and 12' are added thereto.

P-channel MOS transistors 11' and 11 are connected in series between a line of power supply potential VDD and storage node N1 and the gates thereof are both connected to storage node N2. P-channel MOS transistors 12' and 12 are connected in series between a line of power supply potential VDD and storage node N2 and the gates thereof are both connected to storage node N1.

MOS transistors 11, 11', 13 and 13' constitute an inverter giving an inverted signal of a signal held in storage node N2 to storage node N1. MOS transistors 12, 12', 14 and 14' constitute an inverter giving an inverted signal of a signal held in storage node N1 to storage node N2. The other parts of the configuration and operation are the same as corresponding parts of the configuration and operation of memory cell 1 of FIG. 2; therefore none of descriptions thereof is repeated.

In the sixth embodiment, the same effect as in the first and fifth embodiment is obtained.

Seventh Embodiment

Figure 10B:
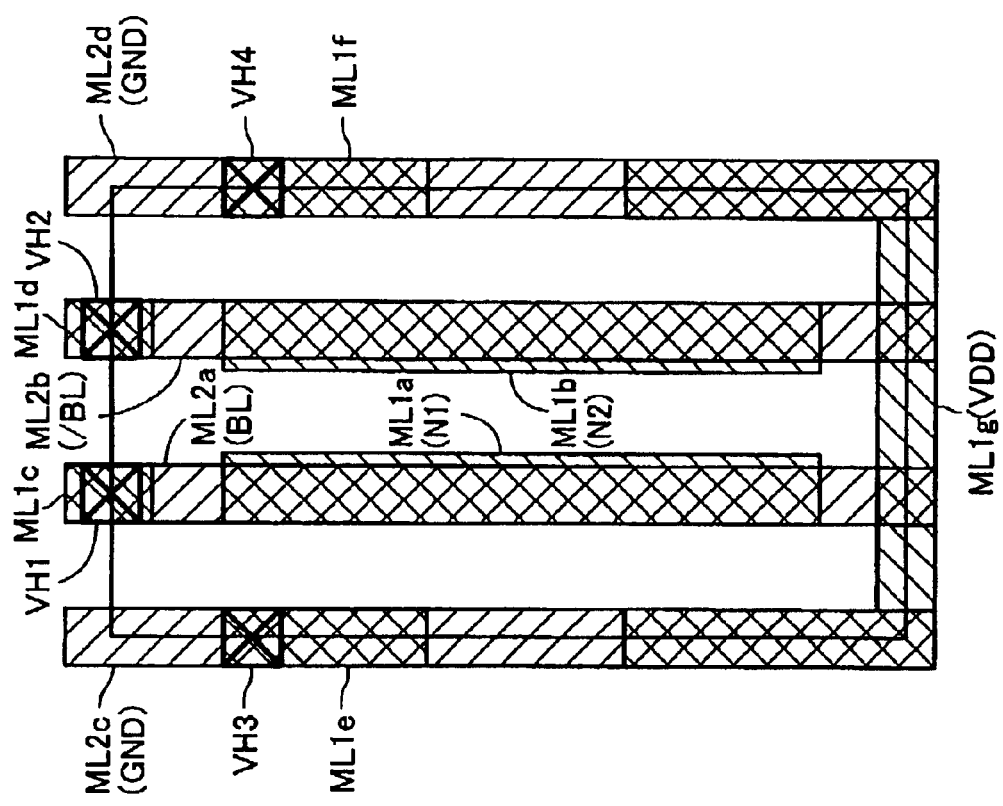
FIGS. 10A and 10B are plan views showing a layout of a memory cell of SRAM according to a seventh embodiment of the present invention.
Figure 10A:
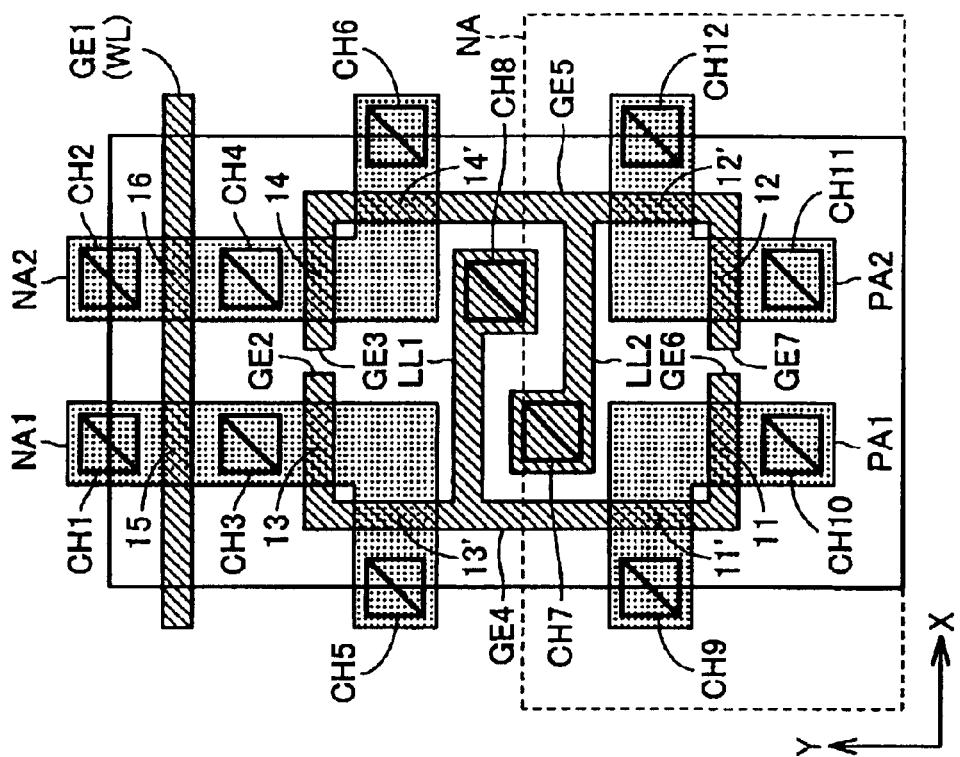

FIGS. 10A and 10B are plan views showing a layout of a memory cell of SRAM according to a seventh embodiment of the present invention and to be compared with FIGS. 5A and 5B. The memory cell has the same configuration as memory cell 22 of FIG. 9, including P-channel MOS transistors 11, 11', 12 and 12'; and N-channel MOS transistors 13, 13', 14, 14' 15 and 16. The memory cell is formed on an SOI substrate.

Referring to FIGS. 10A and 10B, an aspect in which the memory cell is different from memory cell of FIGS. 5A and 5B is that gate electrodes GE6 and GE7 are added thereto and each of P-type active layers PA1 and PA2 are formed in the shape of a letter L.

Gate electrodes GE6 and GE7 are formed on a surface of N-type active layer NA and extend in the X direction of the figure. One end portions of gate electrodes GE6 and GE7 are connected to the other end portions of respective electrodes GE4 and GE5. The other end portions of electrodes GE6 and GE7 are facing each other. P-type active layer PA1 is formed on a surface of N-type active layer NA in the shape of a letter of L so as to traverse gate electrodes GE4 and GE6. P-type active layer PA2 is formed on the surface of N-type active layer NA in the shape of a letter of L so as to traverse gate electrodes GE5 and GE7. Gate electrodes GE4 and P-type active layer PA1 constitute P-channel MOS transistor 11' and gate electrodes GE6 and P-type active layer PA1 constitute P-channel MOS transistor 11. Gate electrodes GE5 and P-type active layer PA2 constitute P-channel MOS transistor 12' and gate electrodes GE7 and P-type active layer PA2 constitute P-channel MOS transistor 12.

One end portion of P-type active layer PA1 (the source of P-channel MOS transistor 11') is connected to metal interconnect ML1g (a line of power supply potential VDD) through contact hole CH9. The other end portion of P-type active layer PA1 (the drain of P-channel MOS transistor 11) is connected to metal interconnect ML1a (storage node N1) through contact hole CH10. One end portion of P-type active layer PA2 (the source of P-channel MOS transistor 12') is connected to metal interconnect ML1g (a line of power supply potential VDD) through contact hole CH12. The other end portion of P-type active layer PA2 (the drain of P-channel MOS transistor 12) is connected to metal interconnect ML1b (storage node N2) through contact hole CH11. The other part of the configuration is the same as corresponding part of the configuration of the memory cell of FIGS. 5A and 5B; therefore none of descriptions thereof is repeated.

In the seventh embodiment, each set of the gate electrodes GE2 and GE5 of N-channel MOS transistors 13 and 13', the gate electrodes GE3 and GE5 of N-channel MOS transistors 14 and 14', the gate electrodes GE6 and GE4 of P-channel MOS transistors 11 and 11', and the gate electrodes GE7 and GE5 of P-channel MOS transistors 12 and 12' is placed such that the gate electrodes intersect with each other at a right angle. Accordingly, since data in storage nodes N1 and N2 is inverted only when an α-particle flies in a direction at angle of 45 degrees to the X direction in a horizontal plane including the body regions of MOS transistors 11 to 14 and 11' to 14' and in addition, strikes the body regions of MOS transistors 11, 11', 12, 12', 13, 13', 14 or 14', soft error resistance is enhanced compared with a prior art practice.

Eighth Embodiment

Figure 11B:
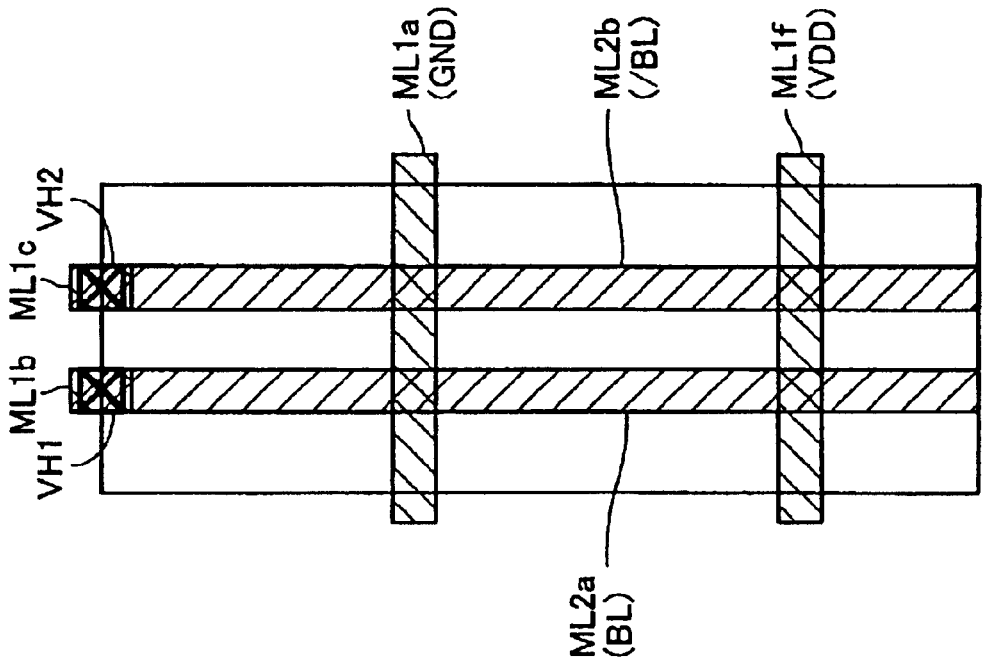
FIGS. 11A and 11B are plan views showing a layout of a memory cell of SRAM according to an eighth embodiment of the present invention.
Figure 11A:
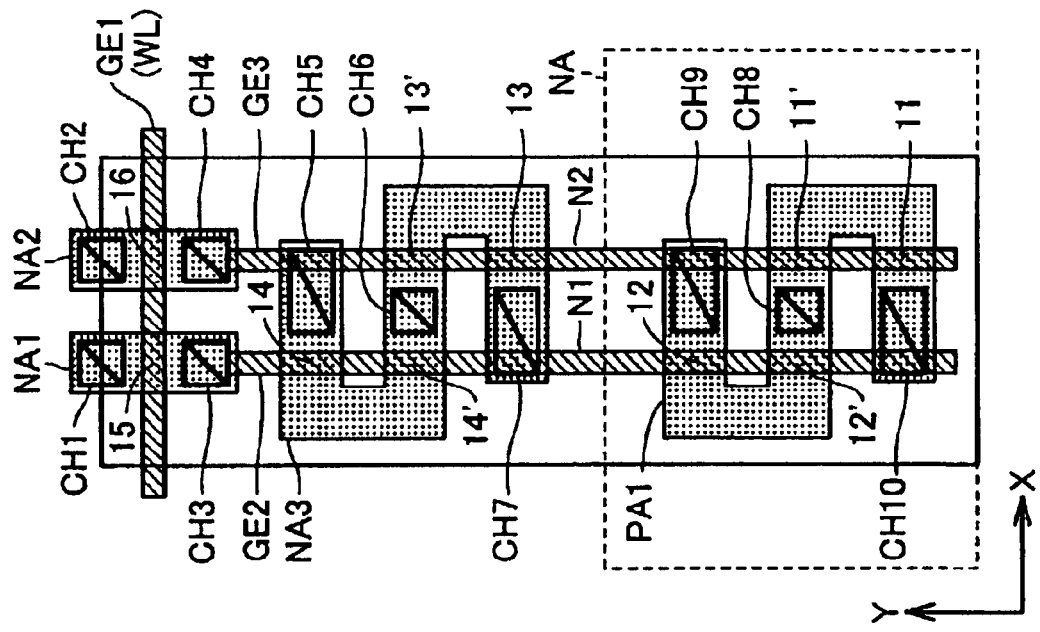

FIGS. 11A and 11B are plan views showing a layout of a memory cell of SRAM according to an eighth embodiment of the present invention and to be compared with FIGS. 6A and 6B. The memory cell has the same configuration as memory cell 22 of FIG. 9, including P-channel MOS transistors 11, 11', 12 and 12' and N-channel MOS transistors 13, 13', 14, 14', 15 and 16. The memory cell is formed on an SOI substrate.

Referring to FIGS. 11A and 11B, an aspect in which the memory cell is different from the memory cell of FIG. 6 is that P-type active layers PA1 and PA2 are replaced with P-type active layer PA1 of the shape of a letter S and metal interconnects ML1d, ML1e, ML2c and ML2d are deleted therefrom but metal interconnect ML1f formed using a second interconnection layer is added thereto.

On N-type active layer NA, P-type active layer PA1 is formed so as to traverse gate electrodes GE3 and GE2 from one side of gate electrode GE3, then traverse gate electrodes GE2 and GE3, and furthermore, traverse Ge3 and GE2. Two intersections between P-type active layer PA1 and gate electrode GE2 constitute P-channel MOS transistors 12 and 12'. Two intersecting portions between P-type active layer PA1 and gate electrode GE3 constitute P-channel MOS transistors 11 and 11'.

One end portion of P-type active layer PA1 (the drain of P-channel MOS transistor 12) and gate electrode GE3 are connected to each other through the plug layer in contact hole CH9, and the other end portion of P-type active layer PA1 (the drain of P-channel MOS transistor 11) and gate electrode GE2 are connected to each other through the plug layer in contact hole CH10. The middle portion of P-type active layer PA1 (the sources of P-channel MOS transistors 11' and 12') is connected to metal interconnect ML1f (a line of power supply potential VDD) through contact hole CH8. The other part of the configuration is the same as corresponding part of the configuration of the memory cell of FIGS. 6A and 6B; therefore none of descriptions thereof is repeated.

In the eighth embodiment, not only are the gate electrode GE2 of MOS transistors 14, 14', 12 and 12' placed on a straight line, but the gate electrode GE3 of MOS transistors 13', 13, 11' and 11 is placed on a straight line. Accordingly, since data in storage nodes N1 and N2 is inverted only when an α-particle flies in the Y direction in a horizontal plane including the body regions of MOS transistors 11 to 14 and 11' to 14' and in addition strikes the body regions of MOS transistors 11, 12', 13' and 14, soft error resistance is enhanced compared with a prior art practice.1

Ninth Embodiment

Figure 12B:
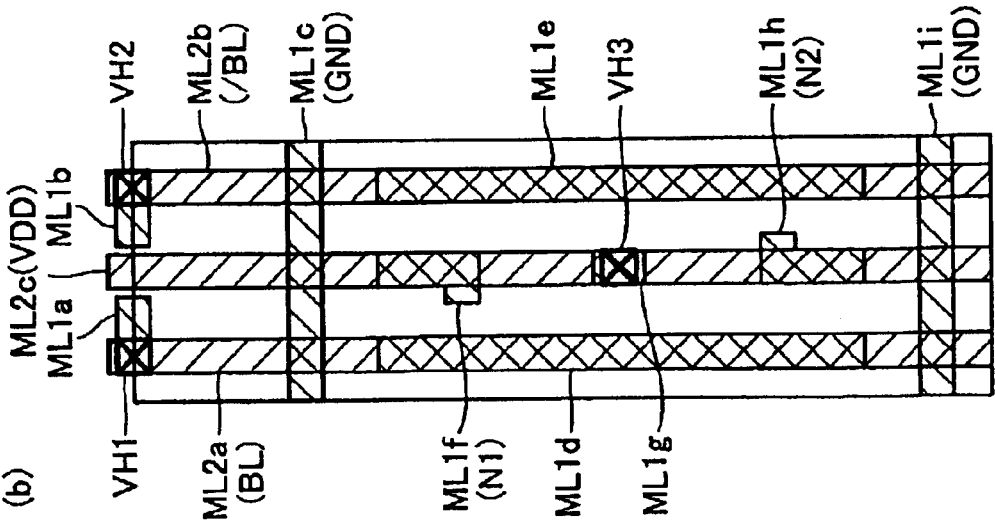
FIGS. 12A and 12B are plan views showing a layout of a memory cell of SRAM according to a ninth embodiment of the present invention.
Figure 12A:
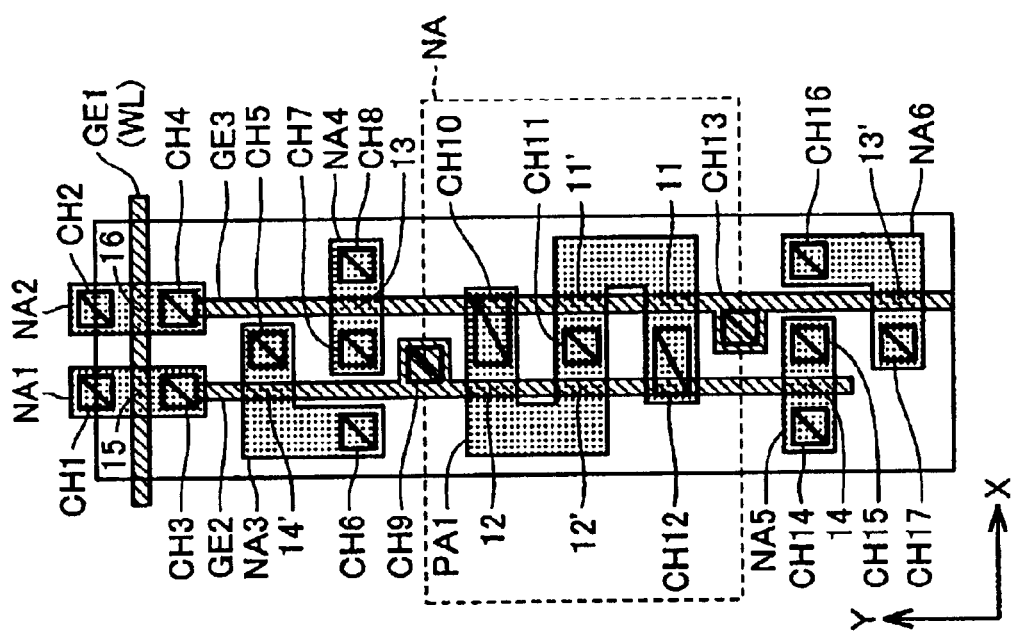

FIGS. 12A and 12B are plan views showing a layout of a memory cell of SRAM according to a ninth embodiment of the present invention. The memory cell has the same configuration as the memory cell of FIG. 9, including P-channel MOS transistors 11, 11', 12 and 12' and N-channel MOS transistors 13, 13', 14, 14', 15 and 16. The memory cell is formed on an SOI substrate.

First of all as shown in FIG. 12A, N-type active region NA is formed on the middle portion of an element region of a P-type silicon layer of the SOI substrate. Then, there are formed gate electrode GE1 extending in the X direction of the figure on a surface of the P-type layer on one side, and gate electrodes GE2 and GE3 extending in the Y direction of the figure from the surface of the P-type silicon layer on the one side over a surface of N-type active layer NA to the surface of the P-type layer on the other side. Gate electrode GE1 constitutes word line WL. One end portions of gate electrodes GE2 and GE3 are placed facing one side of gate electrode GE1.

Then, on the P-type silicon layer on the one side, not only is N-type active layer NA1 of the shape of a letter I formed from one end portion of gate electrode GE2 over to the other side of gate electrode GE1, but N-type active layer NA2 of the shape of a letter I is also formed from one end portion of gate electrode GE3 to the other side of gate electrode GE1. Furthermore, on the P-type silicon layer on the one side, N-type active layer NA3 of the shape of a letter L and N-type active layer NA4 of the shape of a letter I are formed so as to traverse gate electrodes GE2 and GE3. Furthermore, on the P-type silicon layer on the other side, not only are N-type active layer NA5 of the shape of a letter I and N-type active layer NA6 of the shape of a letter L are formed so as to traverse gate electrodes GE2 and GE3. Moreover, on N-type active layer NA, P-type active layer PA1 of the shape of a letter S is formed so as to traverse gate electrodes GE3 and GE2 from one side of gate electrode GE3, then traverse gate electrodes GE2 and GE3, and further, traverse gate electrodes GE3 and GE2.

N-type active layer NA1 and gate electrode GE1 constitute N-channel MOS transistor 15, and N-type active layer NA2 and gate electrode GE1 constitute N-channel MOS transistor 16. N-type active layer NA3 and gate electrode GE2 constitute N-channel MOS transistor 14', and N-type active layer NA4 and gate electrode GE3 constitute N-channel MOS transistor 13. N-type active layer NA5 and gate electrode GE2 constitute N-channel MOS transistor 14 and N-type active layer NA6 and gate electrode GE3 constitute N-channel MOS transistor 13'. Two intersecting portions between P-type active layer PA1 and gate electrode GE2 constitute P-channel MOS transistors 12 and 12'. Two intersecting portion between P-type active layer PA1 and gate electrode GE3 constitute P-channel MOS transistors 11' and 11.

Then, as shown in FIG. 12B, there are formed metal interconnects ML1a to ML1i, and furthermore, metal interconnects ML2a to ML2c extending in the Y direction of the figure using a second metal interconnect layer. Ground potential GND is given onto Metal interconnects ML1c and ML1i. Metal interconnects ML1f and ML1h constitute parts of respective storage nodes N1 and N2. Metal interconnects ML2a and ML2b constitute respective bit lines BL and /BL. Power supply potential VDD is given onto metal interconnect ML2c.

One end portion of N-type active layer NA1 (the drain of N-channel MOS transistor 15) is connected to metal interconnect ML2a (bit line BL) through contact hole CH1, metal interconnect ML1a and via hole VH1. One end portion of N-type active layer NA2 (the drain of N-channel MOS transistor 16) is connected to metal interconnect ML2b (bit line /BL) through contact hole CH2, metal interconnect ML1b and via hole VH2. The other end portion of N-type active layer NA1 (the source of N-channel MOS transistor 15) is connected to one end portion of gate electrode GE2 through a plug layer in contact hole CH3 and the other end portion of N-type active layer NA2 (the source of N-channel MOS transistor 16) is connected to one end portion of gate electrode GE3 through a plug layer in contact hole CH4.

One end portion of N-type active layer NA3 (the source of N-channel MOS transistor 14') is connected to metal interconnect ML1c (a line of ground potential GND) through contact hole CH5. The other end portion of N-type active layer NA3 (the drain of N-channel MOS transistor 14') and the other end portion of N-type active layer NA5 (the source of N-channel MOS transistor 14) are connected to metal interconnect ML1d through respective contact holes CH6 and CH14. The other end portion of N-type active layer NA5 (the drain of N-channel MOS transistor 14) and gate electrode GE3 (the gates of N-channel MOS transistors 11, 11', 13 and 13') are connected to metal interconnect ML1h (storage node N2) through respective contact holes CH15 and CH13.

One end portion of N-type active layer NA6 (the source of N-channel MOS transistor 13') is connected to metal interconnect ML1i (a line of ground potential GND) through contact hole CH17. The other end portion of N-type active layer NA5 (the drain of N-channel MOS transistor 13') and the other end portion of N-type active layer NA4 (the source of N-channel MOS transistor 13) are connected to metal interconnect ML1e through respective contact holes CH16 and CH8. The other end portion of N-type active layer NA4 (the drain of N-channel MOS transistor 13) and gate electrode GE2 (gate of N-channel MOS transistors 12, 12', 14 and 14') are connected to metal interconnect ML1f (storage node N2) through respective contact holes CH7 and CH8.

One end portion of P-type active layer PA1 (the drain of P-channel MOS transistor 12') and the other end portion thereof (the drain of P-channel MOS transistor 11) are connected to respective gate electrodes GE3 and GE2 through plug layers in contact holes CH10 and CH12. The middle portion of P-type active layer PA1 (the sources of P-channel MOS transistors 11' and 12') are connected to metal interconnect ML2c (a line of power supply potential VDD) through contact hole CH12, metal interconnect ML1g and via hole VH3.

In the ninth embodiment, P-channel MOS transistors 11, 11', 12 and 12' are placed on the middle of an element region, N-channel MOS transistors 13 and 14' are placed on one end side thereof, while N-channel MOS transistors 13' and 14 are placed on the other end side thereof. Therefore, since distances between N-channel MOS transistors 13 and 13', and between N-channel MOS transistors 14 and 14' are long, a probability is very low that an α-particle passes though N-channel MOS transistors 13 and 13' or 14 and 14'. Accordingly, it can be prevented from occurring that storage data in storage nodes N1 and N2 is inverted, thereby enabling improvement on soft error resistance.

Tenth Embodiment

Figure 13:
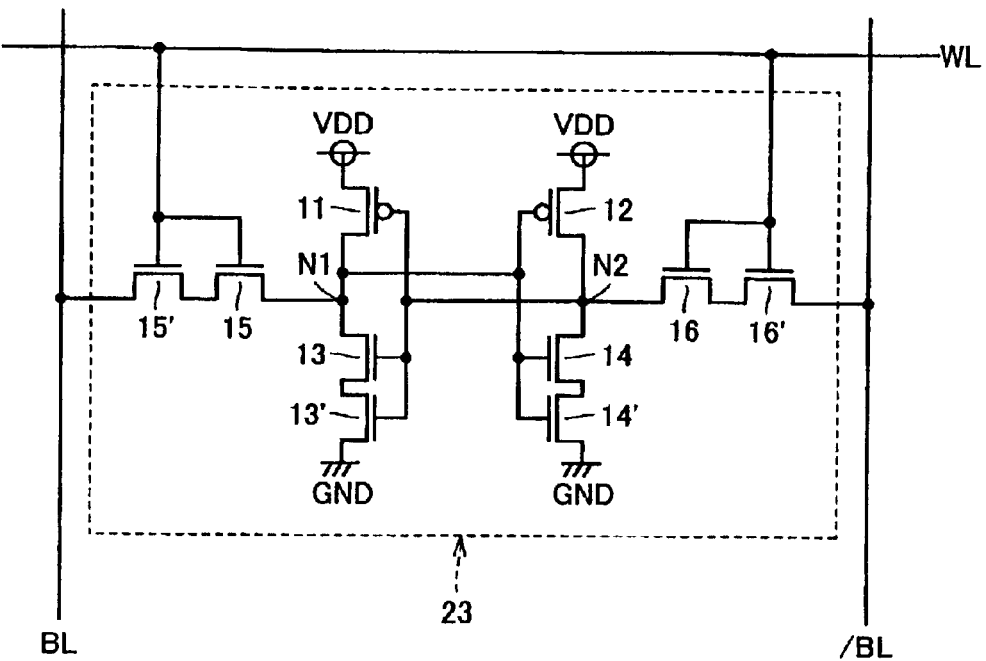
FIG. 13 is a circuit diagram showing a configuration of a memory cell of SRAM according to a tenth embodiment of the present invention.

FIG. 13 is a circuit diagram showing a configuration of a memory cell 23 of SRAM according to a tenth embodiment of the present invention. In FIG. 13, an aspect in which memory cell 23 is different from memory cell 1 of FIG. 2 is that N-channel MOS transistors 15' and 16' are added thereto.

N-channel MOS transistors 15 and 15' are connected in series between storage node N1 and bit line BL and the gates thereof are both connected to word line WL. N-channel MOS transistors 16 and 16' are connected in series between storage node N2 and bit line /BL and the gates thereof are both connected to word line WL. Since the other parts of the configuration and operation are the same as corresponding parts of the configuration and operation of memory cell 1 of FIG. 2, none of descriptions thereof is repeated.

In the tenth embodiment, not only are two N-channel MOS transistors 15 and 15' connected in series between storage node N1 and bit line BL, but two N-channel MOS transistors 16 and 16' are also connected in series between storage node N2 and bit line/BL. Accordingly, since storage data in storage nodes N1 and N2 is not inverted unless one α-particle passes through two N-channel MOS transistors 15 and 15' or 16 and 16', the storage data is harder to be inverted compared with a prior art case where if one α-particle passed through one N-channel MOS transistor 85 or 86, storage data was inverted.

Eleventh Embodiment

Figure 14:
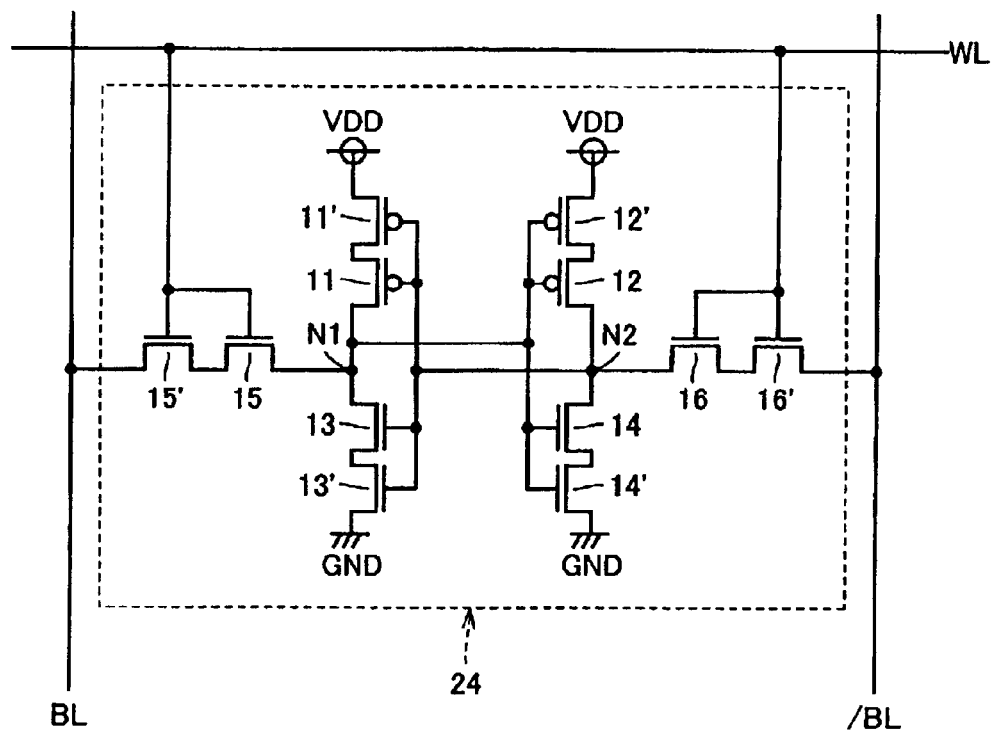
FIG. 14 is a circuit diagram showing a configuration of a memory cell of SRAM according to an eleventh embodiment of the present invention.

FIG. 14 is a circuit diagram showing a configuration of a memory cell 24 of SRAM according to an eleventh embodiment of the present invention. An aspect in which memory cell 24 is different from memory cell 23 of FIG. 13 is that P-channel MOS transistors 11' and 12' are added thereto.

P-channel MOS transistors 11 and 11' are connected in series between storage node N1 and a line of power supply potential VDD and the gates thereof are both connected to storage node N2. P-channel MOS transistors 12 and 12' are connected in series between storage node N2 and a line of power supply potential VDD and the gates thereof are both connected to storage node N1.

In the eleventh embodiment, the same effect as in the first, fifth and tenth embodiment is obtained.

Twelve Embodiment

Figure 15B:
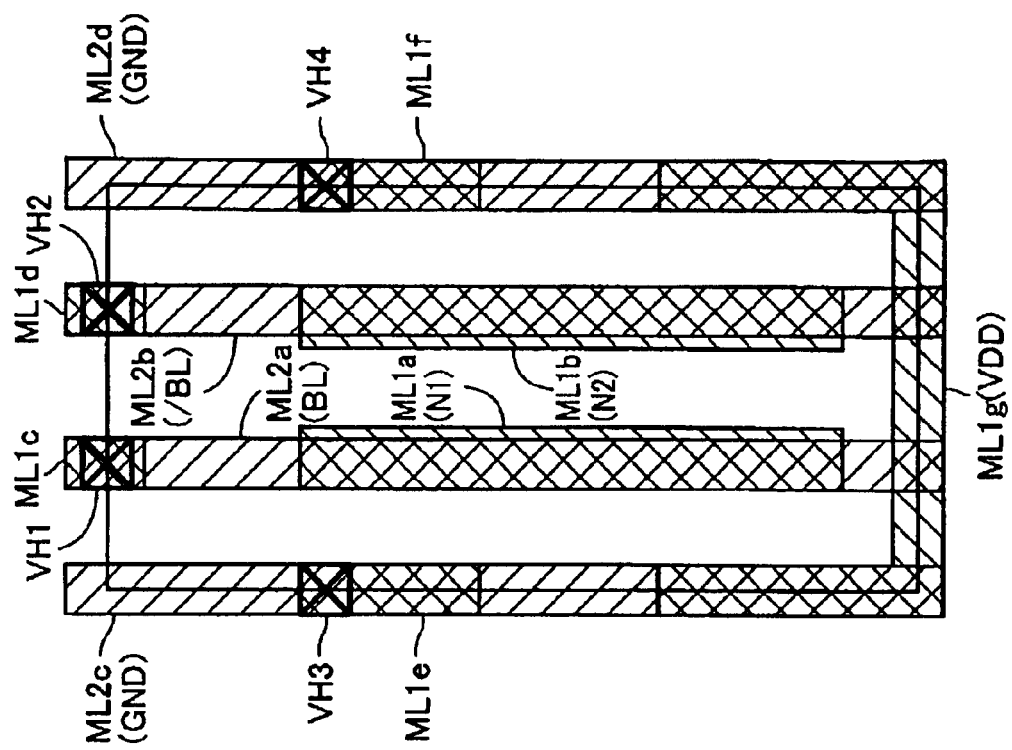
FIGS. 15A and 15B are plan views showing a layout of a memory cell of SRAM according to a twelfth embodiment of the present invention.
Figure 15A:
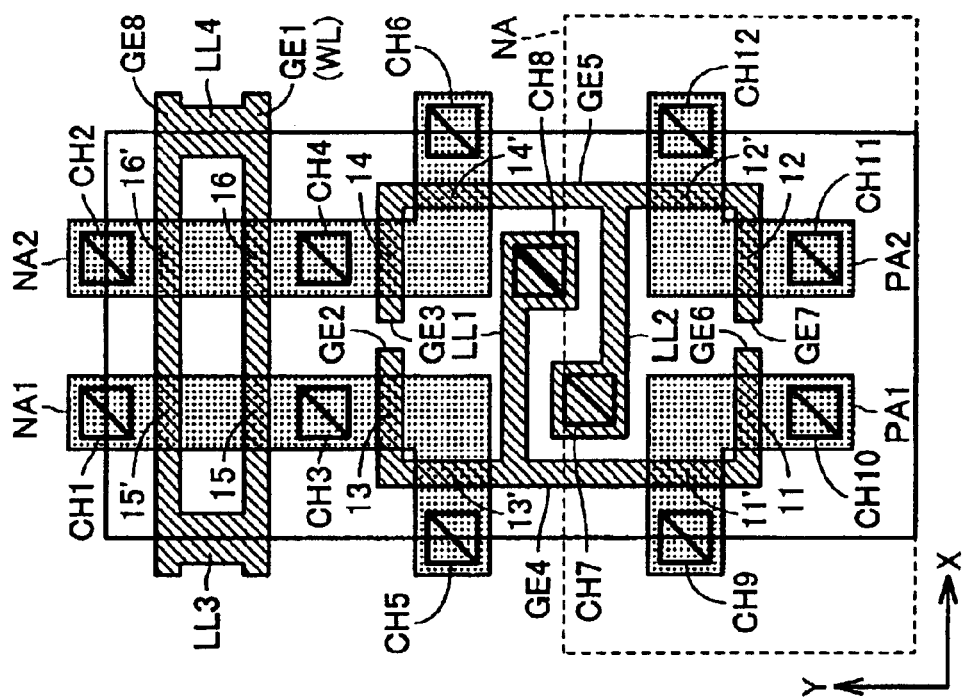

FIGS. 15A and 15B are plan views showing a layout of a memory cell of SRAM according to a twelfth embodiment of the present invention and to be compared with FIGS. 10A and 10B. The memory cell has the same configuration as memory cell 24 of FIG. 14, including P-channel MOS transistors 11, 11', 12 and 12' and N-channel MOS transistors 13 to 16 and 13' to 16'. The memory cell is formed on an SOI substrate.

Referring to FIGS. 15A and 15B, an aspect in which the memory cell is different from the memory cell of FIGS. 10A and 10B is that gate electrode GE8 and local interconnects LL3 and LL4 are added thereto. Gate electrode GE8 is placed in parallel to and adjacent to gate electrode GE1. Gate electrodes GE8 and GE1 are connected to each other at the boundary portions of an element region by local interconnects LL3 and LL4. Gate electrode GE8 and N-type active layer NA1, and gate electrode GE8 and N-type active layer NA2 constitute respective N-channel MOS transistors 15' and 16'. Since the other part of the configuration is the same as a corresponding part of the configuration of the memory cell of FIGS. 10A and 10B, none of descriptions thereof is repeated.

In the twelfth embodiment, since gate electrode GE1 of N-channel MOS transistors 15 and 16, and gate electrode GE8 of N-channel MOS transistors 15' and 16' are placed in parallel to each other, increase in layout area caused by addition of N-channel MOS transistors 15' and 16' can be restricted to the lowest possible level.

Thirteenth Embodiment

Figure 16A:
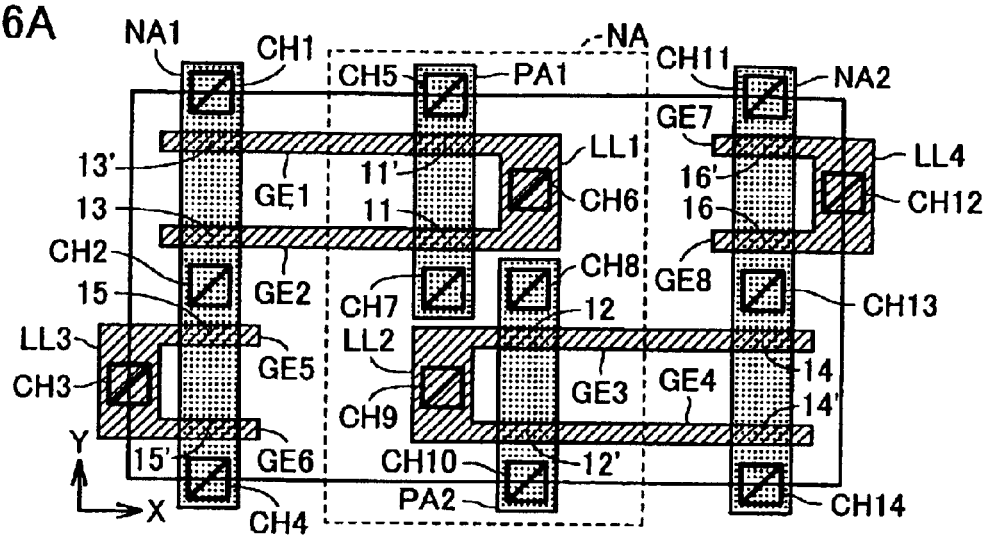
FIGS. 16A, 16B and 16C are plan views showing a layout of a memory cell of SRAM according to a thirteenth embodiment of the present invention.
Figure 16B:
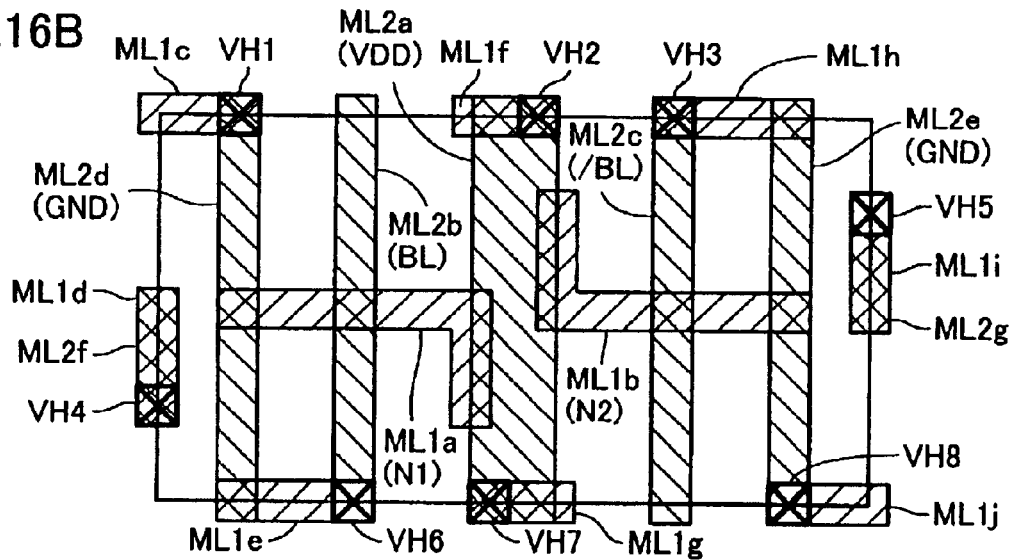
Figure 16C:
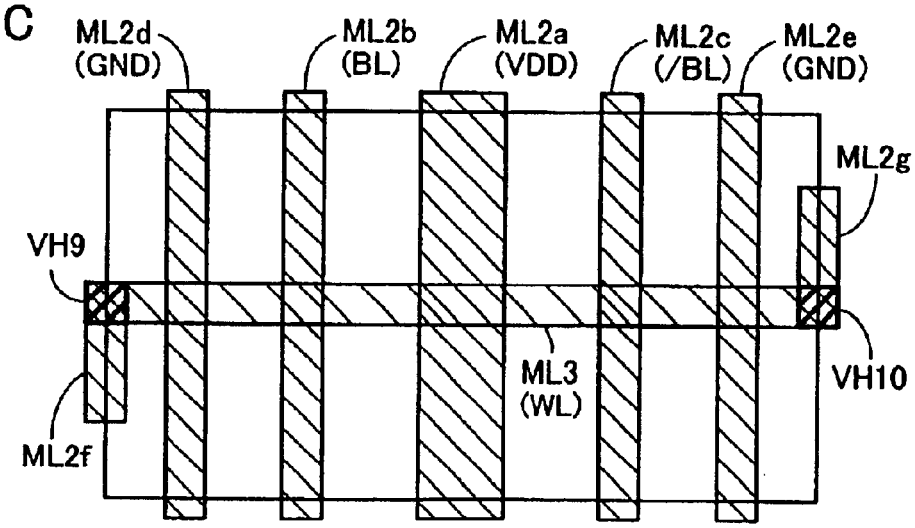

FIGS. 16A, 16B and 16C are plan views showing a layout of a memory cell of SRAM according to a thirteenth embodiment of the present invention. The memory cell has the same circuit configuration as memory cell 24 of FIG. 14, including P-channel MOS transistors 11, 11', 12 and 12'; and N-channel MOS transistors 13 to 16 and 13' to 16'. The memory cell is formed on an SOI substrate.

First of all, as shown in FIG. 16A, N-type active region NA is formed on the middle portion of an element region of a P-type silicon layer of the SOI substrate. Then, there are formed two gate electrodes GE1 and GE2 extending in the X direction of the figure from a surface of N-type active layer NA over to a surface of the P-type silicon layer on one side thereof, two gate electrodes GE3 and GE4 extending in the X direction of the figure from the surface of N-type active layer NA over to the surface of the P-type silicon layer on the other side thereof, two gate electrodes GE5 and GE6 extending in the X direction of the figure on the surface of the P-type silicon layer on the one side thereof, two gate electrodes GE7 and GE8 extending in the X direction of the figure on the surface of the P-type silicon layer on the other side thereof, and local interconnects LL1 to LL4 extending in the Y direction of the figure.

Gate electrodes GE1 and GE7, GE2 and GE8, GE3 and GE5, and GE4 and GE6 are placed on respective straight lines. One end portions of gate electrodes GE1 and GE2, GE3 and GE4, GE5 and GE6, and GE7 and GE8 are connected to each other through respective local interconnects LL1 to LL4.

Then, on the P-type silicon layer, not only is N-type active layer NA1 formed so as to traverse gate electrodes GE1, GE2, GE5 and GE6, but N-type active layer NA2 is also formed so as to traverse gate electrodes GE7, GE8, GE3 and GE4. Furthermore, on the N-type silicon layer NA, not only is P-type active layer PA1 formed so as to traverse gate electrodes GE1 and GE2, but P-type active layer PA2 is also formed so as to traverse gate electrodes GE3 and GE4.

N-type active layer NA1 and gate electrode GE1 constitute N-channel MOS transistor 13', N-type active layer NA1 and gate electrode GE2 constitute N-channel MOS transistor 13, N-type active layer NA1 and gate electrode GE5 constitute N-channel MOS transistor 15, and N-type active layer NA1 and gate electrode GE6 constitute N-channel MOS transistor 15'. N-type active layer NA2 and gate electrode GE7 constitute N-channel MOS transistor 16', N-type active layer NA2 and gate electrode GE8 constitute N-channel MOS transistor 16, N-type active layer NA2 and gate electrode GE3 constitute N-channel MOS transistor 14 and N-type active layer NA2 and gate electrode GE4 constitute N-channel MOS transistor 14'. P-type active layer PA1 and gate electrode GE1 constitute P-channel MOS transistor 11', and P-type active layer PA1 and gate electrode GE2 constitute P-channel MOS transistor 11. P-type active layer PA2 and gate electrode GE3 constitute P-channel MOS transistor 12, and P-type active layer PA2 and gate electrode GE4 constitute P-channel MOS transistor 12'.

Then, as shown in FIGS. 16B and 16C, metal interconnects ML1a to ML1j are formed using a first metal interconnection layer, then metal interconnects ML2a to ML2g are formed using a second metal interconnection layer and furthermore, metal interconnect ML3 is formed using a third metal interconnection layer. Metal interconnects ML1a and ML1b constitute parts of storage nodes N1 and N2. Each of metal interconnects ML1c to ML1j, ML2f and ML2g is used as a connection electrode. Power supply potential VDD is given onto metal interconnect ML2a while ground potential GND is given onto metal interconnects ML2d and ML2e. metal interconnects ML2b and ML2c constitute respective bit lines BL and /BL. Metal interconnect ML3 constitutes word line WL.

One end portion of N-type active layer NA1 (the source of N-channel MOS transistor 13') is connected to metal interconnect ML2d (a line of ground potential GND) through contact hole CH1, metal interconnect ML1c and via hole VH1. One end portion of N-type active layer NA2 (the source of N-channel MOS transistor 14') is connected to metal interconnect ML2e (a line of ground potential GND) through contact hole CH14, metal interconnect ML1j and via hole VH8.

A region (the drain of N-channel MOS transistor 13 and the source of N-channel MOS transistor 15) between gate electrodes GE2 and GE5 of N-type active layer NA1 is connected to metal interconnect ML1a (storage node N1) through contact hole CH2, one end portion of P-type active layer PA1 (the drain of P-channel MOS transistor 11) is connected to metal interconnect ML1a (storage node N1) through contact hole CH7 and local interconnect LL2 (the gates of MOS transistors 12, 12', 14 and 14') is connected to metal interconnect ML1a (storage node N1) through contact hole CH9. A region (the drain of N-channel MOS transistor 14 and the source of N-channel MOS transistor 16) between gate electrodes GE3 and GE8 of N-type active layer NA2 is connected to metal interconnect ML1b (storage node N2) through contact hole CH13, one end portion of P-type active layer PA2 (the drain of P-channel MOS transistor 12) is connected to metal interconnect ML1b (storage node N2) through contact hole CH8 and local interconnect LL1 (the gates of MOS transistors 11, 11', 13 and 13') is connected to metal interconnect ML1b (storage node N2) through contact hole CH6.

Local interconnect LL3 (the gates of N-channel MOS transistors 15 and 15') is connected to metal interconnect ML3 (word line WL) through contact hole CH3, metal interconnect ML1d, via hole VH4, metal interconnect ML2f and via hole VH9. Local interconnect LL4 (the gates of N-channel MOS transistors 16 and 16') is connected to metal interconnect ML3 (word line WL) through contact hole CH12, metal interconnect ML1i, via hole VH5, metal interconnect ML2g and via hole VH10.

The other end portion of N-type active layer NA1 (the drain of N-channel MOS transistor 15') is connected to metal interconnect ML2b (bit line BL) through contact hole CH4, metal interconnect ML1e and via hole VH6. The other end portion of N-type active layer NA2 (the drain of N-channel MOS transistor 16') is connected to metal interconnect ML2c (bit line /BL) through contact hole CH11, metal interconnect ML1h and via hole VH3.

The other end portion of P-type active layer PA1 (the source of P-channel MOS transistor 11') is connected to metal interconnect ML2a (a line of power supply potential VDD) though contact hole CH5, metal interconnect ML1f and via hole VH2. The other end portion of P-type active layer PA2 (the source of P-channel MOS transistor 12') is connected to metal interconnect ML2a (a line of power supply potential VDD) though contact hole CH10, metal interconnect ML1g and via hole VH7.

In the thirteenth embodiment, the same effect as in the fourth and eleventh embodiments is attained and in addition, P-channel MOS transistors 11 and 11'; and 12 and 12'; and N-channel MOS transistors 15 and 15'; and 16 and 16' are placed in parallel to each other; therefore, increase in layout area caused by the addition of MOS transistors 11', 12', 15' and 16' can be restricted to the lowest possible level.

Fourteenth Embodiment

While in the first to thirteenth embodiments, a so-called one-port SRAM is shown, a multiprocessor technique, in recent years, has been introduced as one measure for realizing high speed operation in computer, requiring sharing of one memory region by plural CPUs. In the fourteenth embodiment, description will be given of a case where the present invention is applied to 2-port SRAM.

Figure 17:
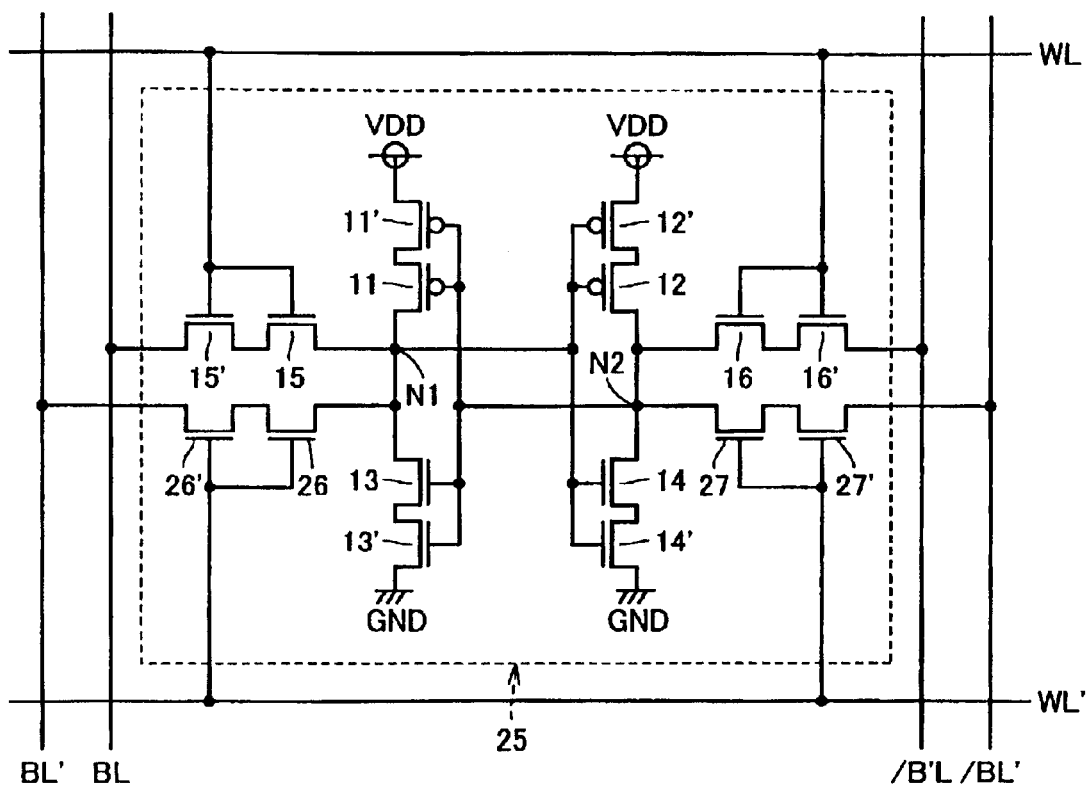
FIG. 17 is a circuit diagram showing a configuration of a memory cell of 2-port SRAM according to a fourteenth embodiment of the present invention.

FIG. 17 is a circuit diagram showing a configuration of a memory cell 25 of 2-port SRAM according to a fourteenth embodiment of the present invention and to be compared with FIG. 14. Referring to FIG. 17, in 2-port SRAM, two word lines WL and WL' and two bit line pairs BL and /BL, and BL' and /BL' are provided correspondingly to one memory cell 25, and one memory cell 25 is shared by two CPUs.

An aspect in which memory cell 25 is different from memory cell 24 of FIG. 14 is that N-channel MOS transistors 26, 26', 27 and 27' are added thereto. N-channel MOS transistors 26 and 26' are connected in series between storage node N1 and bit line BL' and the gates thereof are both connected to word line WL'. N-channel MOS transistors 27 and 27' are connected in series between storage node N2 and bit line /BL' and the gates thereof are both connected to word line WL'.

When access is performed by one of 2 CPUs, word line WL is driven to H level at select level to cause N-channel MOS transistors 15, 15', 16 and 16' to be conductive and to thereby perform read/write operation for storage data in storage nodes N1 and N2. When access is performed by the other of 2 CPUs, word line WL' is driven to H level at select level to cause N-channel MOS transistors 26, 26' 27 and 27' to be conductive and to thereby perform read/write operation for storage data in storage nodes N1 and N2.

In the fourteenth embodiment as well, improvement on soft error resistance is achieved, similar to the eleventh embodiment.

Fifteenth Embodiment

Figure 18A:
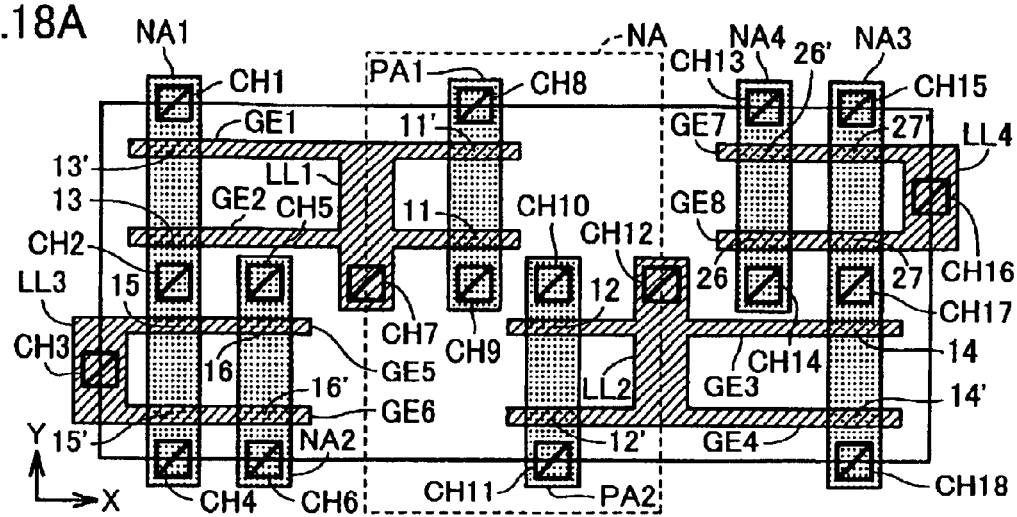
FIGS. 18A, 18B and 18C are plan views showing a layout of a memory cell of 2-port SRAM according to a fifteenth embodiment of the present invention.
Figure 18B:
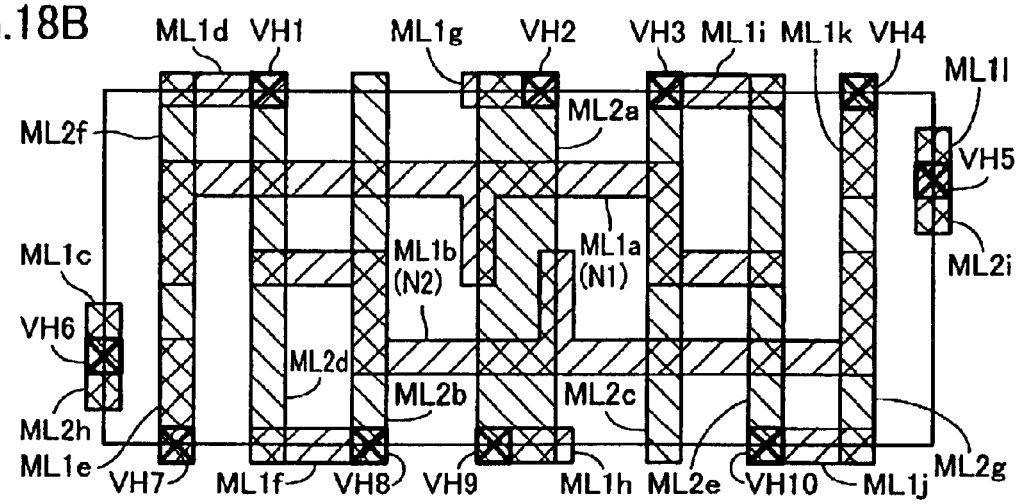
Figure 18C:
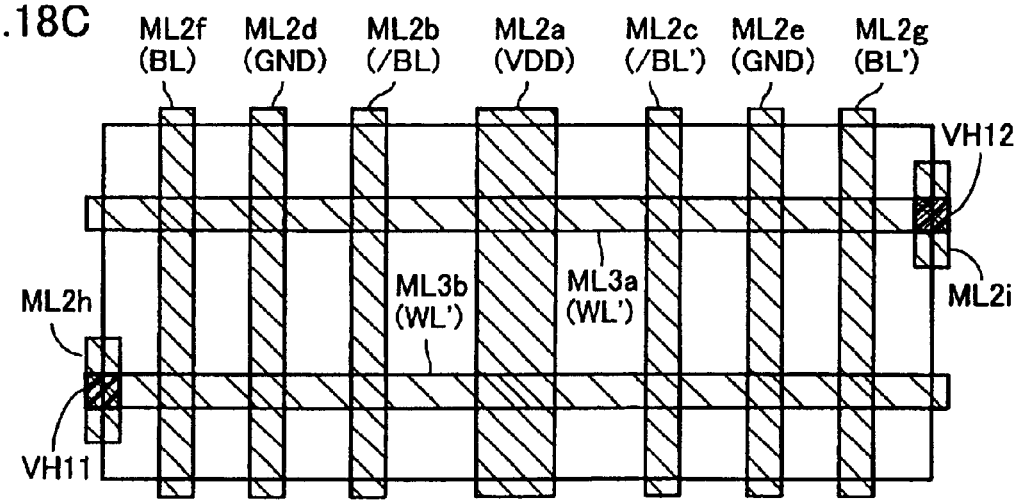

FIGS. 18A, 18B and 18C are plan views showing a layout of a memory cell of 2-port SRAM according to a fifteenth embodiment of the present invention. The memory cell has the same configuration as the memory cell of FIG. 17, including P-channel MOS transistors 11, 11', 12 and 12' and N-channel MOS transistors 13 to 16, 13' to 16', 26, 26', 27 and 27'. The memory cell is formed on an SOI substrate.

First of all, as shown in FIG. 18A, N-type active layer NA is formed on the middle portion of an element-region of a P-type silicon layer in the SOI substrate. Then, there are formed two gate electrodes GE1 and GE2 extending in the X direction of the figure from a surface of N-type active layer NA over to a surface of the P-type silicon layer on one side thereof, two gate electrodes GE3 and GE4 extending in the X direction of the figure from the surface of N-type active layer NA over to the surface of the P-type silicon layer on the other side thereof, two gate electrodes GE5 and GE6 extending in the X direction on the surface of the P-type silicon layer on the one side, two gate electrodes GE7 and GE8 extending in the X direction of the figure on the surface of the P-type silicon layer on the other side and local interconnects LL1 and LL4 extending in the Y direction of the figure.

Gate electrodes GE1 and GE7; GE2 and GE8; GE5 and GE3; and GE6 and GE4 are placed on respective straight lines. The middle portions of gate electrodes GE1 and GE2 are connected to each other by local interconnect LL1 and the middle portions of gate electrodes GE3 and GE4 are connected to each other by local interconnect LL2. One end portions of gate electrodes GE5 and GE6 are connected to each other by local interconnect LL3 and one end portions of gate electrodes GE7 and GE8 are connected to each other by local interconnect LL4.

Then, on the P-type silicon layer on the one side, not only is N-type active layer NA1 formed so as to traverse gate electrodes GE1, GE2, GE5 and GE6, but N-type active layer NA2 is also formed so as to traverse only gate electrodes GE5 and GE6. Furthermore, on the P-type silicon layer on the other side, not only is N-type active layer NA3 formed so as to traverse gate electrodes GE7, GE8, GE3 and GE4, but N-type active layer NA4 is also formed so as to traverse only gate electrodes GE7 and GE8. Moreover, on N-type active layer NA, not only is P-type active layer PA1 formed so as to traverse gate electrodes GE1 and GE2, but P-type active layer PA2 is also formed so as to traverse gate electrodes GE3 and GE4.

N-type active layer NA1 and gate electrode GE1 constitute N-channel MOS transistor 13', N-type active layer NA1 and gate electrode GE2 constitute N-channel MOS transistor 13, N-type active layer NA1 and gate electrode GE5 constitute N-channel MOS transistor 15, and N-type active layer NA1 and gate electrode GE6 constitute N-channel MOS transistor 15'. N-type active layer NA2 and gate electrode GE5 constitute N-channel MOS transistor 16 and N-type active layer NA2 and gate electrode GE6 constitute N-channel MOS transistor 16'. N-type active layer NA3 and gate electrode GE7 constitute N-channel MOS transistor 27', N-type active layer NA3 and gate electrode GE8 constitute N-channel MOS transistor 27, N-type active layer NA3 and gate electrode GE3 constitute N-channel MOS transistor 14, and N-type active layer NA3 and gate electrode GE4 constitute N-channel MOS transistor 14'. N-type active layer NA4 and gate electrode GE7 constitute N-channel MOS transistor 26' and N-type active layer NA4 and gate electrode GE8 constitute N-channel MOS transistor 26. P-type active layer PA1 and gate electrode GE1 constitute P-channel MOS transistor 11' and P-type active layer PA1 and gate electrode GE2 constitute P-channel MOS transistor 11. P-type active layer PA2 and gate electrode GE3 constitute P-channel MOS transistor 12 and P-type active layer PA2 and gate electrode GE4 constitute N-channel MOS transistor 12'.

Then, as shown in FIGS. 18B and 18C, metal interconnects ML1a to ML1l are formed using a first metal interconnection layer, then metal interconnects ML2a to ML2i are formed using a second metal interconnection layer, and further, metal interconnects ML3a and ML3b are formed using a third metal interconnection layer. Metal interconnects ML1a and ML1b constitute parts of respective storage nodes N1 and N2. Each of metal interconnects ML1c to ML1l, ML2h and ML2i is used as a connection electrode. Power supply potential VDD is given onto metal interconnect ML2a while ground potential GND is given onto metal interconnects ML2d and ML2e. Metal interconnects ML2b, ML2c, ML2f and ML2g constitute respective bit lines /BL, /BL' BL and BL'. Metal interconnects ML3a and ML3b constitute respective word lines WL' and WL.

One end portion of N-type active layer NA1 (the source of N-channel MOS transistor 13') is connected to metal interconnect ML2d (a line of ground potential GND) through contact hole CH1, metal interconnect ML1d and via hole VH1. One end portion of N-type active layer NA3 (the source of N-channel MOS transistor 14') is connected to metal interconnect ML2e (the line of ground potential GND) through contact hole CH18, metal interconnect ML1j and via hole VH10.

A region (the drain of N-channel MOS transistor 13 and the source of N-channel MOS transistor 15) between gate electrodes GE2 and GE5 of N-type active layer NA1 is connected to metal interconnect ML1a (storage node N1) through contact hole CH2, one end portion of P-type active layer PA1 (the drain of P-channel MOS transistor 11) is connected to metal interconnect ML1a (storage node N1) through contact hole CH9, local interconnect LL2 (the gates of MOS transistors 12, 12', 14 and 14') is connected to metal interconnect ML1a (storage node N1) through contact hole CH12 and one end portion of N-type active layer NA4 (the source of N-channel MOS transistor 26) is connected to metal interconnect ML1a (storage node N1) through contact hole CH14.

A region (the drain of N-channel MOS transistor 14 and the source of N-channel MOS transistor 27) between gate electrodes GE3 and GE8 of N-type active layer NA3 is connected to metal interconnect ML1b (storage node N2) through contact hole CH17, one end portion of P-type active layer PA2 (the drain of P-channel MOS transistor 12) is connected to metal interconnect ML1b (storage node N2) through contact hole CH10, local interconnect LL1 (the gates of MOS transistors 11, 11', 13 and 13') is connected to metal interconnect ML1b (storage node N2) through contact hole CH7 and one end portion of N-type active layer NA2 (the source of N-channel MOS transistor 16) is connected to metal interconnect ML1b (storage node N2) through contact hole CH15.

Local interconnect LL3 (the gates of N-channel MOS transistors 15, 15', 16 and 16') is connected to metal interconnect ML3b (word line WL) through contact hole CH3, metal interconnect ML1c, via hole VH6, metal interconnect ML2h and via hole VH11. Local interconnect LL4 (the gates of N-channel MOS transistors 26, 26', 27 and 27') is connected to metal interconnect ML3a (word line WL') through contact hole CH16, metal interconnect ML1l, via hole VH5, metal interconnect ML2i and via hole VH12.

The other end portion of N-type active layer NA1 (the drain of N-channel MOS transistor 15') is connected to metal interconnect ML2f (bit line BL) through contact hole CH4, metal interconnect ML1e and via hole VH7. The other end portion of N-type active layer NA2 (the drain of N-channel MOS transistor 16') is connected to metal interconnect ML2b (bit line /BL) through contact hole CH6, metal interconnect ML1f and via hole VH8.

The other end portion of N-type active layer NA3 (the drain of N-channel MOS transistor 27') is connected to metal interconnect ML2g (bit line BL') through contact hole CH15, metal interconnect ML1k and via hole VH4. The other end portion of N-type active layer NA4 (the drain of N-channel MOS transistor 26') is connected to metal interconnect ML2c (bit line /BL') through contact hole CH13, metal interconnect ML1i and via hole VH3.

The other end portion of P-type active layer PA1 (the source of P-channel MOS transistor 11') is connected to metal interconnect ML2a (a line of power supply potential VDD) through contact hole CH8, metal interconnect ML1g and via hole VH2. The other end portion of P-type active layer PA2 (the source of P-channel MOS transistor 12') is connected to metal interconnect ML2a (a line of power supply potential VDD) through contact hole CH11, metal interconnect ML1h and via hole VH9.

In the fifteenth embodiment, not only are N-channel MOS transistors 15, 15', 16 and 16' provided on the one side of the P-type silicon layer, but N-channel MOS transistors 26, 26', 27 and 27' are also provided on the other side of the P-type silicon layer, and furthermore, the gate electrode GE5 of N-channel MOS transistors 15 and 16, and gate electrode GE6 of N-channel MOS transistors 15' and 16' are placed in parallel to each other, and, the gate electrode GE8 of N-channel MOS transistors 26 and 27, and gate electrode GE7 of N-channel MOS transistors 26' and 27' are placed in parallel to each other. Accordingly, increase in layout area caused by addition of N-channel MOS transistors 26, 26' 27 and 27' can be restricted to the lowest possible level.

Sixteenth Embodiment

Figure 19:
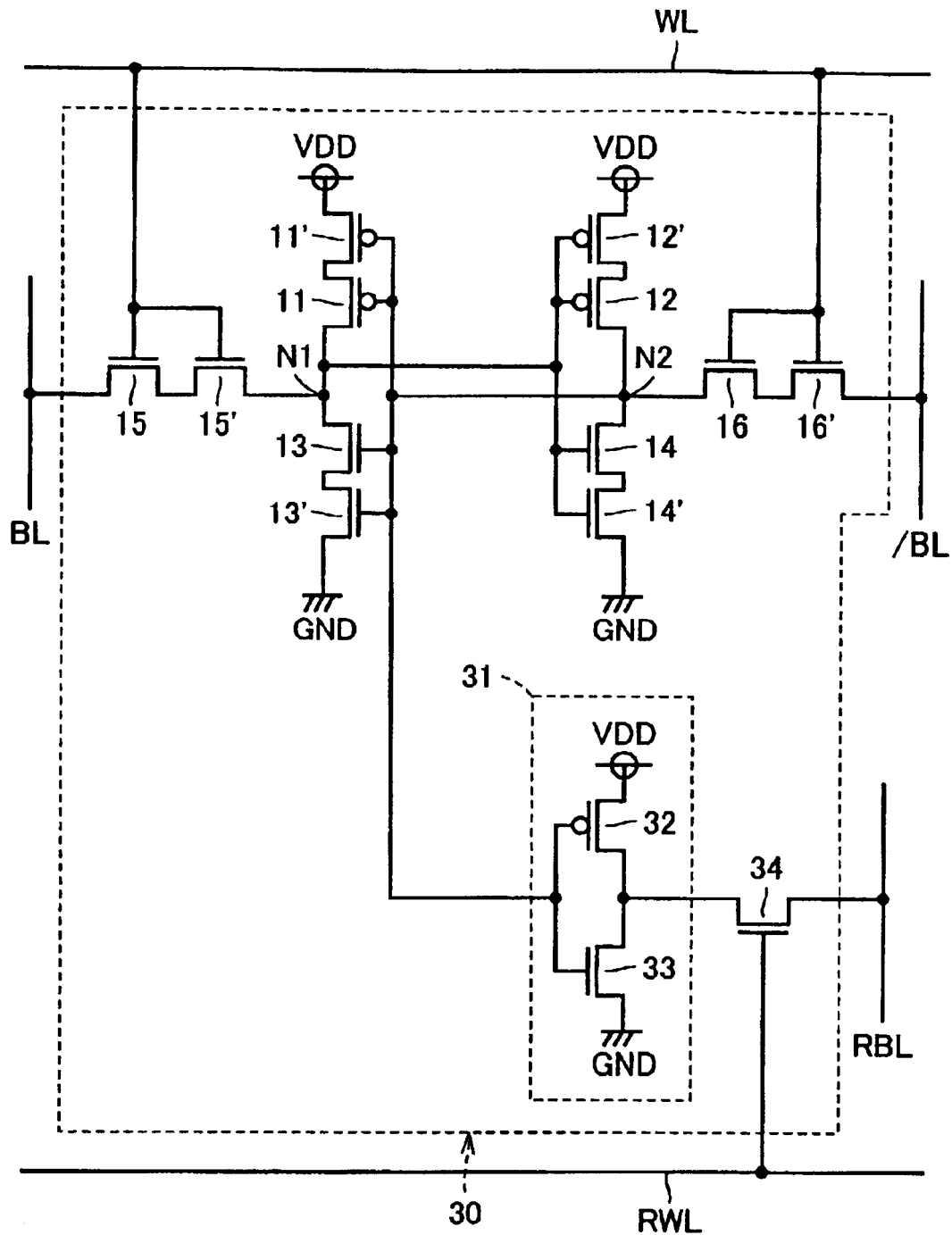
FIG. 19 is a circuit diagram showing a configuration of a memory cell of 2-port SRAM according to a sixteenth embodiment of the present invention.

FIG. 19 is a circuit diagram showing a configuration of a memory cell 30 of 2-port SRAM according to a sixteenth embodiment of the present invention and to be compared with FIG. 14. Referring to FIG. 19, in the 2-port SRAM, word line WL, read word line RWL, bit line pair BL and /BL and read bit line RBL are provided correspondingly to one memory cell 30 and one memory cell 30 is shared by two CPUs.

An aspect in which memory cell 30 is different from memory cell 24 of FIG. 14 is that an inverter 31 and an N-channel MOS transistor 34 are added thereto. Inverter 31 includes: a P-channel MOS transistor 32 and an N-channel MOS transistor 33. P-channel MOS transistor 32 is connected between a line of power supply potential VDD and an output node and the gate thereof is connected to an input node. N-channel MOS transistor 33 is connected between a line of ground potential GND and the output node and the gate thereof is connected to the input node. The input node of inverter 31 is connected to storage node N2. N-channel MOS transistor 34 is connected between the output node of inverter 31 and read bit line RBL and the gate thereof is connected to read word line RWL.

When access is performed by one of two CPUs, word line WL is driven to H level at select level, N-channel MOS transistors 15, 15', 16 and 16' are caused to be conductive and read/write of storage data in storage nodes N1 and N2 is performed.

When access is performed by the other of two CPUs, read word line RWL is driven to H level at select level to cause N-channel MOS transistor 34 to be conductive and a logic level of storage node N2 is inverted by inverter 31 and given to read bit line RBL. Accordingly, while the other CPU can read data, no write of data can be performed.

In the sixteenth embodiment as well, improvement on soft error resistance can be realized, similar to the eleventh embodiment.

Seventeenth Embodiment

Figure 20:
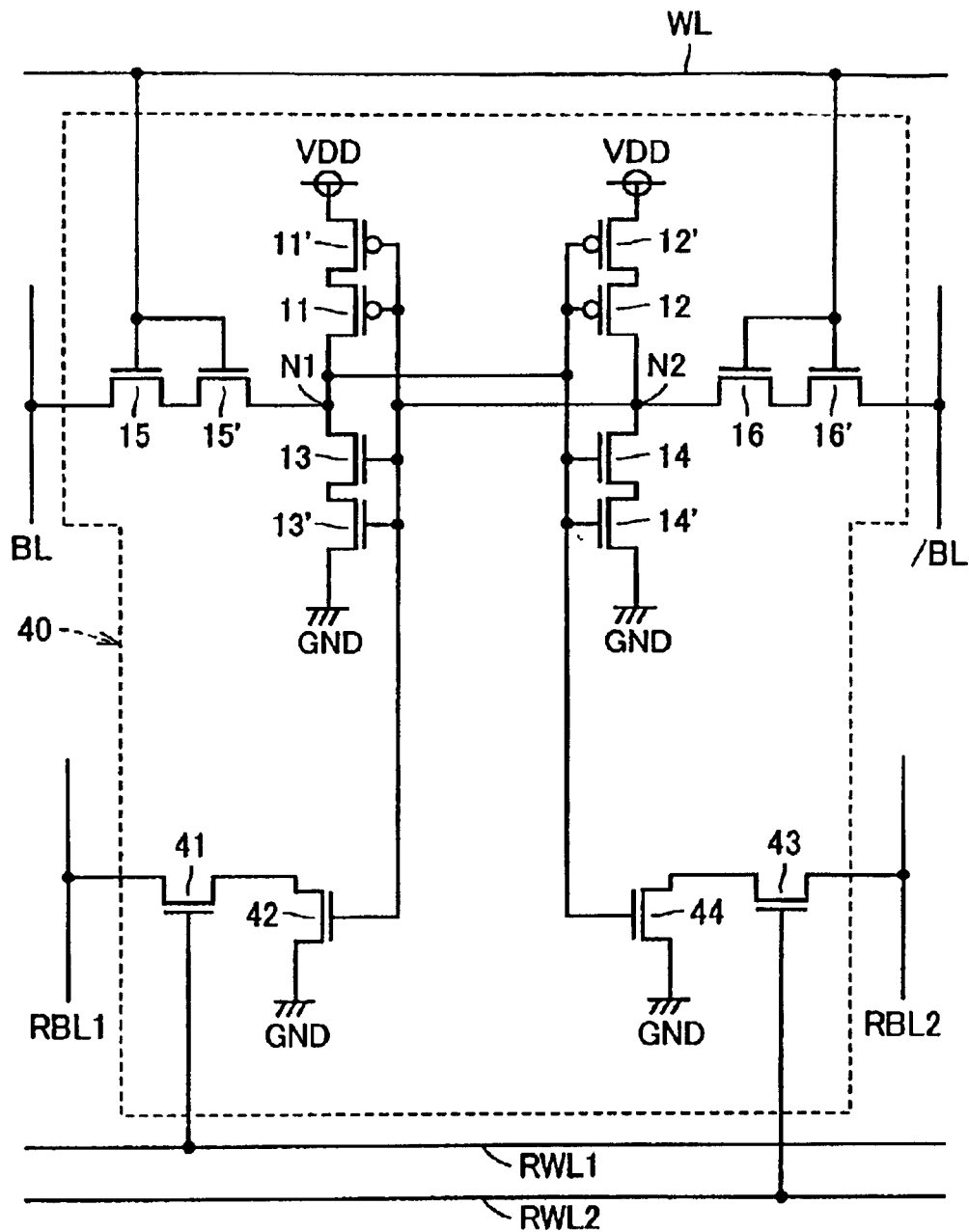
FIG. 20 is a circuit diagram showing a configuration of a memory cell of 3-port SRAM according to a seventeenth embodiment of the present invention.

FIG. 20 is a circuit diagram showing a configuration of a memory cell 40 of 3-port SRAM according to a seventeenth embodiment of the present invention and to be compared with FIG. 14. Referring to FIG. 20, in the 3-port SRAM, word line WL, two read word lines RWL1 and RWL2, bit line pair BL and /BL and two read bit lines RBL1 and RBL2 are provided correspondingly to one memory cell 40 and one memory cell 40 is shared by first to third CPUs.

An aspect in which memory cell 40 is different from memory cell 24 of FIG. 14 is that N-channel MOS transistors 41 to 44 are added thereto. N-channel MOS transistors 41 and 42 are connected in series between read bit line RBL1 and a line of ground potential GND and N-channel MOS transistors 43 and 44 are connected in series between read bit line RBL2 and a line of ground potential GND. The gates of N-channel MOS transistors 41 and 43 are connected to respective read word lines RWL1 and RWL2, and the gates of N-channel MOS transistors 42 and 44 are connected to respective storage nodes N1 and N2.

When access is performed by first CPU, word line WL is driven to H level at select level to cause of N-channel MOS transistors 15, 15', 16 and 16' to be conductive and read/write of storage data in storage nodes N1 and N2 are performed.

When access is performed by second CPU, read bit line RBL1 is precharged to H level, thereafter read word line RWL1 is driven to H level at select level to cause N-channel MOS transistor 41 to be conductive. When storage node N2 is at H level, N-channel MOS transistor 42 becomes conductive to drive read bit line RBL1 to L level. When storage node N2 is at L level, N-channel MOS transistor 42 becomes non-conductive to keep read bit line RBL1 unchanged at H level. Accordingly, by detecting a logic level on read bit line RBL1, storage data in storage node N2 can be read.

When access is performed by third CPU, read bit line RBL2 is precharged to H level, thereafter read word line RWL2 is driven to H level at select level to cause N-channel MOS transistor 43 to be conductive. When storage node N1 is at H level, N-channel MOS transistor 44 becomes conductive to drive read bit line RBL2 to L level. When storage node N1 is at L level, N-channel MOS transistor 44 becomes non-conductive to keep read bit line RBL2 unchanged at H level. Accordingly, by detecting a logic level on read bit line RBL2, storage data in storage node N1 can be read.

In the seventeenth embodiment as well, improvement on soft error resistance can be realized, similar to the eleventh embodiment.

Figure 21:
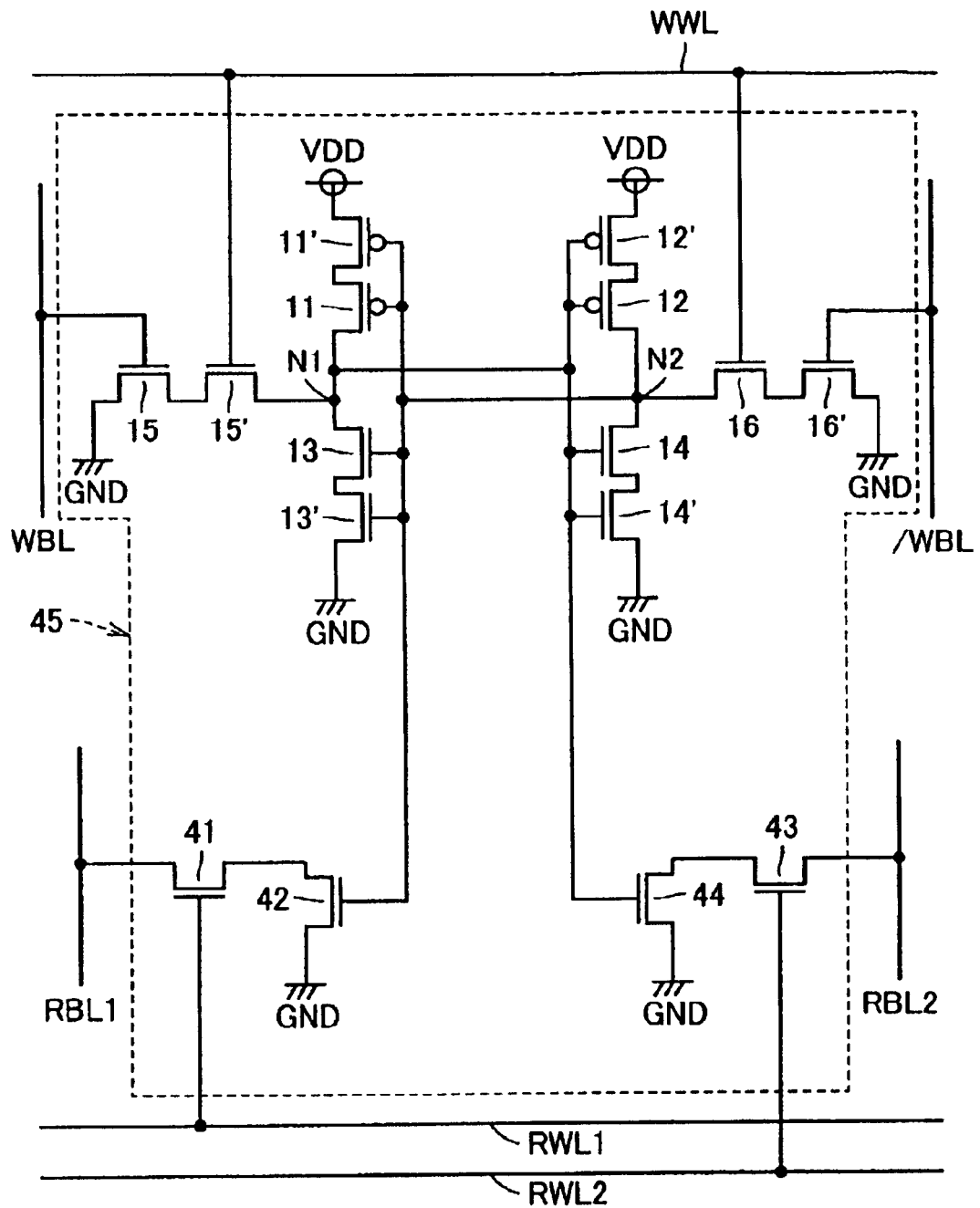
FIG. 21 is a circuit diagram showing a modification of the seventeenth embodiment of the present invention.

FIG. 21 is a circuit diagram showing a configuration of a memory cell 45 of 3-port SRAM according to a modification of the seventeenth embodiment, which is to be compared with FIG. 20. Referring to FIG. 21, in this 3-port SRAM, a write word line WWL, two read word lines RWL1, RWL2, a write bit line pair WBL, /WBL, and two read bit lines RBL1, RBL2 are provided corresponding to one memory cell 45, and one memory cell 45 is shared by the first to third CPUs.

Memory cell 45 differs from memory cell 40 of FIG. 20 in that N channel MOS transistors 15', 16 have their gates connected to write word line WWL instead of word line WL, N channel MOS transistors 15, 16' have their gates connected to write bit lines WBL, /WBL, respectively, instead of word line WL, and N channel MOS transistors 15, 16' have their sources connected to a line of ground potential GND instead of bit lines BL, /BL. In the seventeenth embodiment, the first CPU is capable of performing both read and write. By comparison, in this modification, the first CPU is exclusively used for writing; it cannot perform reading. The operations of the second and third CPUs are the same as in the seventeenth embodiment.

The write operation of the first CPU is now described. In an initial state, write word line WWL and write bit lines WBL, /WBL are all at L level. It is assumed that storage nodes N1 and N2 hold H level and L level, respectively. When the write operation starts, either one of write bit lines WBL, /WBL (e.g., WBL) is driven to H level according to a logic level of a write data signal. Thus, N channel MOS transistor 15 is rendered conductive, while N channel MOS transistor 16' remains non-conductive.

Next, write word line WWL is driven to H level of selected level, and N channel MOS transistors 15', 16 are rendered conductive. At this time, storage node N1 is electrically connected to a line of ground potential GND via N channel MOS transistors 15', 15, whereas storage node N2 becomes floating because N channel MOS transistor 16' is non-conductive. Thus, storage node N1 becomes L level while storage node N2 becomes H level, so that the logic of the data held in memory cell 45 is inverted. Thereafter, write word line WWL and write bit line WBL are both driven to L level to end the write operation. In this SRAM, it is possible to make storage nodes N1, N2 and bit lines WBL, /WBL of memory cell 45 (non-written cell) for which write is not to be performed completely non-conductive to each other.

More specifically, assume that in the write operation it is desired to write a data signal to only a small number of memory cells 45 among a plurality of memory cells 45 connected to the same write word line WWL. In this case, bit line WBL or /WBL corresponding to the small number of memory cells 45 may be driven to H level, while keeping bit lines WBL and /WBL corresponding to memory cells 45 to which a data signal is not to be written both at L level. By doing so, when write word line WWL is driven to H level, storage node N1 or N2 is connected to a line of ground potential GND in memory cell 45 to which a data signal is desired to be written, so that write of the data signal is carried out. In memory cell 45 to which a data signal is not to be written, storage nodes N1, N2 are not connected to a line of ground potential GND even if write word line WWL is driven to H level, and data stored therein is maintained.

In this modification, since storage nodes N1, N2 and bit lines WBL, /WBL of a non-written cell is kept completely non-conductive to each other, erroneous write of a data signal to the non-written cell can be prevented. Further, since write bit lines WBL, /WBL corresponding to the non-written cell remain unchanged both at L level, unnecessary power is consumed, so that power consumption can be kept low. Although the modification to the SRAM of FIG. 20 has been described in conjunction with FIG. 21, it is needless to say that a similar modification to the SRAM of FIG. 19 is also conceivable.

Eighteenth Embodiment

In recent years, a demand has been arisen for mounting a cache memory in the same chip for high speed operation of a computer. This is a scheme in which since access to a large capacity memory outside the chip requires much time, data stored in an address space of the external memory is transferred to a high speed cache memory in the chip, thereby realizing a high speed CPU. In this scheme, it is required to retrieve, in an instant, weather or not data has been transferred to the cache memory and such a comparative coincidence retrieval function is provided to a content addressable memory (CAM). In the eighteenth embodiment, description will be given of a case where the present invention is applied to a content addressable memory.

Figure 22:
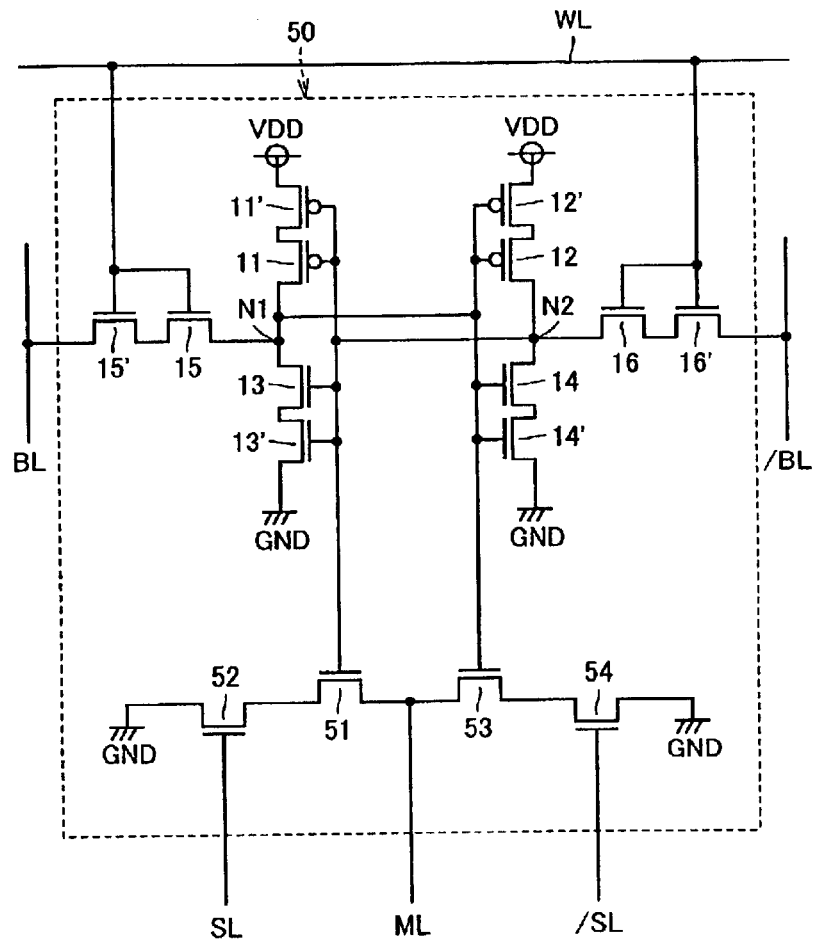
FIG. 22 is a circuit diagram showing a configuration of a memory cell of a content addressable memory according to an eighteenth embodiment of the present invention.

FIG. 22 is a circuit diagram showing a configuration of a memory cell 50 of a content addressable memory according to a eighteenth embodiment of the present invention and to be compared with FIG. 14. Referring to FIG. 21, this content addressable memory includes: word line WL; bit line pair BL and /BL; match line ML; and search line pair SL and /SL. An aspect in which memory cell 50 is different from memory cell 24 of FIG. 14 is that N-channel MOS transistors 51 to 54 are added thereto. N-channel MOS transistors 51 and 52 are connected in series between match line ML and a line of ground potential GND, and N-channel MOS transistors 53 and 54 are connected in series between match line ML and a line of ground potential GND. The gates of N-channel MOS transistors 51 and 53 are connected to respective storage nodes N2 and N1, and N-channel MOS transistors 52 and 54 are connected to respective search lines SL and /SL.

Ordinary write/read operation is performed similarly to the first embodiment. In comparison operation, at first, not only are search lines SL and /SL both driven to L level, but match line ML is precharged to H level. At this time, N-channel MOS transistors 52 and 54 are in a non-conductive state to shut off match line ML from the lines of ground potential GND.

Then, one of search lines SL and /SL is driven to H level according to data to be compared. For example, when search lines SL and /SL are driven to H and L levels, respectively, in a case where storage nodes N1 and N2 are at H and L levels, respectively, not only do N-channel MOS transistors 52 and 53 become conductive, but N-channel MOS transistors 51 and 54 also become non-conductive to keep match line ML at H level. Thereby, information can be obtained on coincidence of data in storage nodes N1 and N2 with data on search lines SL and /SL.

Furthermore, when search lines SL and /SL are driven to H and L levels, respectively, in a case where storage nodes N1 and N2 are at L and H levels, respectively, not only do N-channel MOS transistors 51 and 52 become conductive, but N-channel MOS transistors 53 and 54 also become non-conductive to drive match line ML to L level. Thereby, information can be obtained on non-coincidence of data in storage nodes N1 and N2 with data on search lines SL and /SL.

In the eighteenth embodiment as well, improvement on soft error resistance can be realized, similar to the eleventh embodiment.

Nineteenth Embodiment

Figure 23:
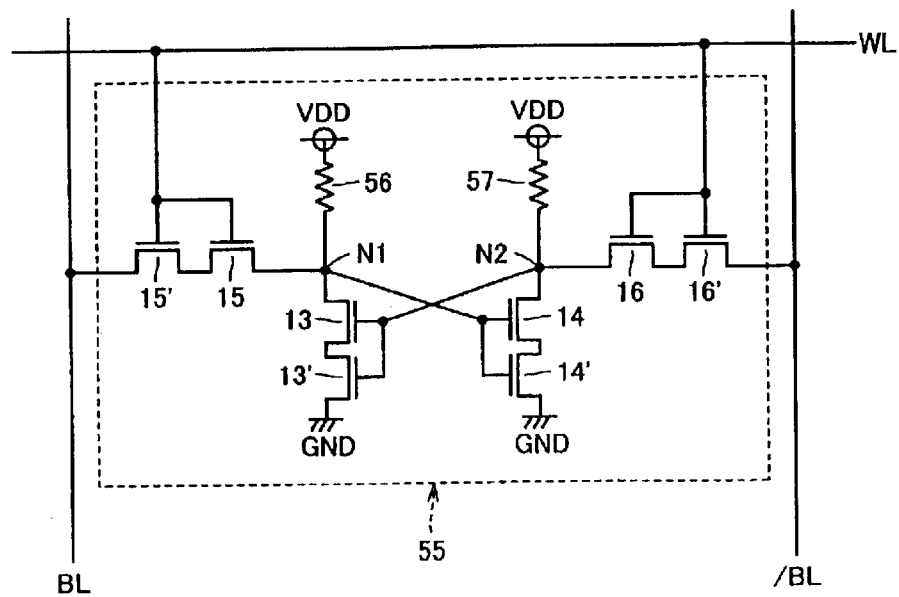
FIG. 23 is a circuit diagram showing a configuration of a memory cell of SRAM according to a nineteenth embodiment of the present invention.

FIG. 23 is a circuit diagram showing a configuration of a memory cell 55 of SRAM according to a nineteenth embodiment of the present invention. In FIG. 23, an aspect in which memory cell 55 is different from memory cell 24 of FIG. 14 is that P-channel MOS transistors 11, 11', 12 and 12' are replaced with resistance elements 56 and 57. Resistance elements 56 and 57 are connected, respectively, between a line of power supply potential VDD and storage node N1, and between a line of power supply potential VDD and storage node N2.

Resistance element 56 and N-channel MOS transistors 13 and 13' constitute an inverter giving an inverted signal of a signal occurring on storage node N2 to storage node N1. Resistance element 57 and N-channel MOS transistors 14 and 14' constitute an inverter giving an inverted signal of a signal occurring on storage node N1 to storage node N2. Since the other parts of the configuration and operation are the same as corresponding parts of the configuration and operation of the first embodiment, non of descriptions thereof is repeated.

In the nineteenth embodiment as well, improvement on soft error resistance can be realized, similar to the eleventh embodiment.

Twentieth Embodiment

Figure 24:
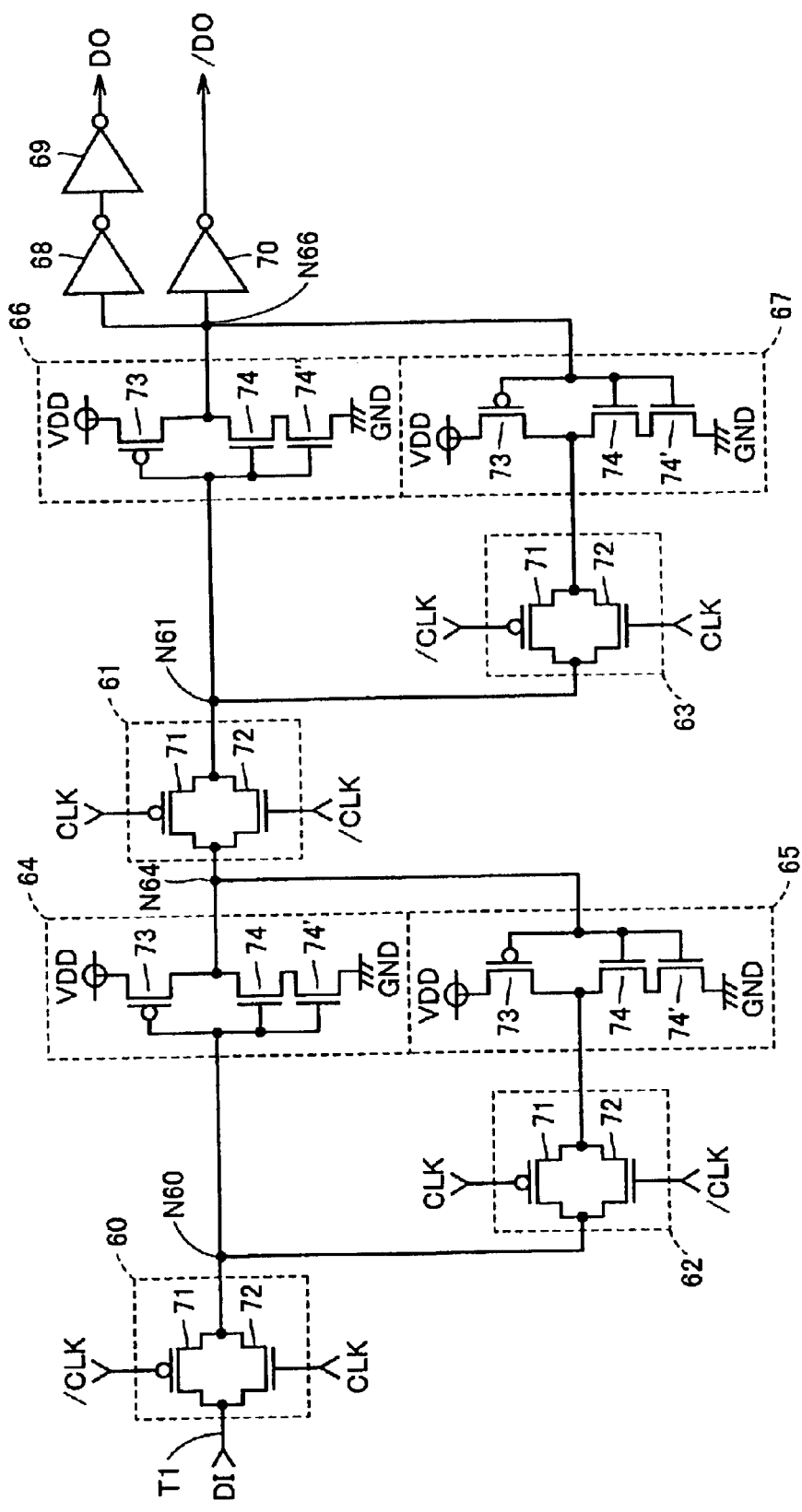
FIG. 24 is a circuit diagram showing a configuration of a flip-flop circuit according to a twentieth embodiment of the present invention.
Figure 25:
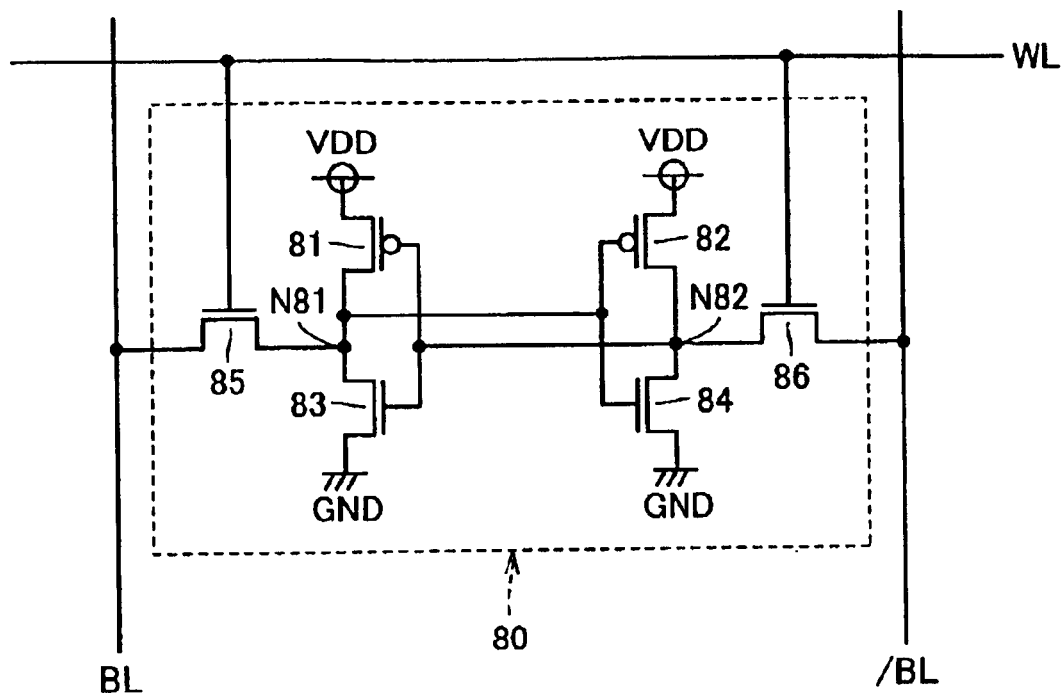
FIG. 25 is a circuit diagram showing a configuration of a memory cell of prior art SRAM.

FIG. 24 is a circuit diagram showing a configuration of a flip-flop circuit according to a twentieth embodiment of the present invention. In FIG. 24, the flip-flop circuit includes: transfer gates 60 to 63; and inverters 64 to 70.

Transfer gate 60, inverter 64, transfer gate 61 and inverters 66, 68 and 69 are connected in series between a data input terminal T1 and a data output terminal T2. Inverter 65 and transfer gate 62 are connected in series between an output node N64 of inverter 64 and an input node N60 thereof. Inverter 67 and transfer gate 63 are connected in series between an output node N66 of inverter 66 and an input node N61 thereof. Inverter 70 is connected between node N66 and an inverted data output terminal T3.

Each of transfer gates 60 to 63 includes P-channel MOS transistor 71 and N-channel MOS transistor 72 in parallel connection. A clock signal CLK is inputted to the gate of N-channel MOS transistor 72 of each of transfer gates 60 ad 63 and the gate of P-channel MOS transistor 71 of each of transfer gates 61 and 62. An inverted clock signal /CLK is inputted to the gate of P-channel MOS transistor 71 of each of transfer gates 60 ad 63 and the gate of N-channel MOS transistor 72 of each of transfer gates 61 and 62. Transfer gates 60 and 63 are conductive in a period when clock signal CLK is at H level and transfer gates 61 and 62 are conductive in a period when clock signal CLK is at L level.

Each of inverters 64 and 67 includes: P-channel MOS transistor 73 and N-channel MOS transistors 74 and 74'. P-channel MOS transistor 73 is connected between a line of power supply potential VDD and an output node and the gate thereof is connected to an input node thereof. N-channel MOS transistors 74 and 74' are connected in series between the output node thereof and a line of ground potential GND and the gates thereof are both connected to the input node. When the input node is at H level, not only does P-channel MOS transistor 73 become non-conductive, but N-channel MOS transistors 74 and 74' also become conductive to drive the output node to L level. When the input node is at L level, not only do N-channel MOS transistors 74 and 74' become non-conductive, but P-channel MOS transistor 73 also become conductive to drive the output node to H level.

Then, description will be given of operation of the flip-flop circuit. When clock signal CLK is at L level, not only do transfer gates 60 and 63 become non-conductive, but transfer gates 61 and 62 also become conductive. Thereby, not only is a logic level of node N60 is latched by inverters 64 and 65 and transfer gate 62, but the logic level of node N60 is also outputted to data output terminal T2 through inverter 64, transfer gate 61 and inverters 66, 68 and 69.

When clock signal CLK is raised from L level to H level, not only do transfer gates 60 and 63 become conductive, but transfer gates 61 and 62 become non-conductive. Thereby, not only is a logic level of node N66 is latched by inverters 67 and 66 and transfer gate 63, but a logic level of node N66 is also outputted to data output terminal T2 through inverters 68 and 69. Furthermore, a logic level of data input terminal T1 is captured by node 60.

In the twentieth embodiment, since in each of inverters 64 to 67, two N-channel MOS transistors 74 and 74' are connected in series between an output node and a line of ground potential GND, improvement can be realized on soft error resistance, similar to the first embodiment.

Note that needless to say that in each of inverters 64 to 67, two P-channel MOS transistors may be connected in series between an output node and a line of power supply potential VDD.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory circuit formed on a SOI comprising:

two inverters connected between first and second storage nodes, an input node of each inverter being connected to an output node of the other inverter, wherein said inverters each includes:

plural first MOS transistors with a first conductivity type, connected in series between a line of a first power supply potential and the output node, and whose gate electrodes are all connected to the input node; and a MOS second transistor with a second conductivity type, connected between a line of a second power supply potential and the output node, and whose gate electrode is connected to the input node, wherein each said first MOS transistor has a body region provided beneath the sate electrode, and the body region of each said first MOS transistor is spaced apart from the body region of another said first MOS transistor.

2. The semiconductor memory circuit according to claim 1, wherein said semiconductor memory circuit is placed at an intersecting portion of a word line and first and second bit lines and further comprises:

plural third MOS transistors connected in series between said first bit line and said first storage node, and becoming conductive in response to transition of said word line to select level; and plural fourth MOS transistors connected in series between said second bit line and said second storage node, and becoming conductive in response to transition of said word line to select level.

3. The semiconductor memory circuit according to claim 1, wherein the gate electrodes of said plural first MOS transistors extend at a right angle to each other.

4. The semiconductor memory circuit according to claim 1, wherein the gate electrodes of said plural first MOS transistors extend in the same direction along one straight line.

5. The semiconductor memory circuit according to claim 1, wherein the gate electrodes of said plural first MOS transistors extend in parallel to each other.

6. The semiconductor memory circuit according to claim 2, wherein the gate electrodes of the first MOS transistors, the second MOS transistor, the third MOS transistors and the fourth MOS transistors extend in the same direction as each other.

7. The semiconductor memory circuit according to claim 1, wherein said semiconductor memory circuit is formed on a surface of a first semiconductor layer of a first conductivity type, and surfaces of second and third semiconductor layers of a second conductivity type located on one side of said first semiconductor layer and on the other side thereof, respectively, said second MOS transistors of said two inverters are all formed on the surface of said first semiconductor layer, and said plural first MOS transistors of one of said two inverters are all formed on the surface of said second semiconductor layer, while said plural first MOS transistors of the other inverter are all formed on the surface of said third semiconductor layer.

8. The semiconductor memory circuit according to claim 1, wherein said semiconductor memory circuit is formed on a surface of a first semiconductor layer of a first conductivity type, and surfaces of second and third semiconductor layers of a second conductivity type located on one side of said first semiconductor layer and the other side thereof, respectively, said second MOS transistors of said two inverters are all formed on the surface of said first semiconductor layer, and said plural first MOS transistors of one of the two inverters are formed on said surfaces of second and third semiconductor layers in a distributed manner, and said plural first MOS transistors of the other inverter are formed on said surface of second and third semiconductor layers in a distributed manner.

9. The semiconductor memory circuit according to claim 1, wherein said semiconductor memory circuit is placed at an intersecting portion of a word line and first and second bit lines, a read word line and a read bit line are provided correspondingly to said semiconductor memory circuit, and said semiconductor memory circuit further comprises read circuits giving a logic level of one of said first and second storage nodes to said read bit line in response to transition of said read word line to select level.

10. The semiconductor memory circuit according to claim 1, wherein said semiconductor memory circuit is placed at an intersecting portion of a word line and first and second bit lines, a search line and a match line are provided correspondingly to said semiconductor memory circuit, and said semiconductor memory circuit further comprises a coincidence/non-coincidence detection circuit detecting whether or not a logic level of one of said first and second storage nodes coincides with a logic level given onto said search line to give a signal at a level corresponding to a result of the detection to said match line.

11. The semiconductor memory circuit according to claim 1, wherein said inverters each include plural third MOS transistors with a second conductivity type, and said second MOS transistor, connected in series between a line of the second power supply potential and the output node, and whose gate electrodes are all connected to the input node.

12. The semiconductor memory circuit according to claim 11, wherein said semiconductor memory circuit is placed at an intersecting portion of a word line and first and second bit lines and further comprises:

plural fourth MOS transistors connected in series between said first bit line and said first storage node, and becoming conductive in response to transition of said word line to select level; and plural fifth MOS transistors connected in series between said second bit line and said second storage node, and becoming conductive in response to transition of said word line to select level.

13. The semiconductor memory circuit according to claim 11, wherein the gate electrodes of said plural first MOS transistors extend at a right angle to each other, and the gate electrodes of said plural third MOS transistors extend at a right angle to each other.

14. The semiconductor memory circuit according to claim 11, wherein the gate electrodes of said plural first MOS transistors extend in the same direction along one straight line, and the gate electrodes of said plural third MOS transistors extend in the same direction along another straight line.

15. The semiconductor memory circuit according to claim 11, wherein the gate electrodes of said plural first MOS transistors extend in parallel to each other, and the gate electrodes of said plural third MOS transistors extend in parallel to each other.

16. The semiconductor memory circuit according to claim 12, wherein the gate electrodes of said first MOS transistors, said third MOS transistors, said fourth MOS transistors and said fifth MOS transistors extend in the same direction as each other.

17. The semiconductor memory circuit according to claim 11, wherein said semiconductor memory circuit is formed on a surface of a first semiconductor layer of a first conductivity type, and surfaces of second and third semiconductor layers of a second conductivity type located on one side of said first semiconductor layer and the other side thereof, respectively, said plural third MOS transistors of said two inverters are all formed on the surface of said first semiconductor layer, and said plural first MOS transistors of one of said two inverters are all formed on the surface of said second semiconductor layer, while said plural first MOS transistors of the other inverter are all formed on the surface of said third semiconductor layer.

18. The semiconductor memory circuit according to claim 11, wherein said semiconductor memory circuit is formed on a surface of a first semiconductor layer of a first conductivity type, and surfaces of second and third semiconductor layers of a second conductivity type located on one side of said first semiconductor layer and the other side thereof, respectively, said plural first MOS transistors of one of said two inverters are formed on the surfaces of said second and third semiconductor layers in a distributed manner, and said plural first MOS transistors of the other inverter are formed on the surfaces of said second and third semiconductor layers in a distributed manner.

19. The semiconductor memory circuit according to claim 1, wherein said semiconductor memory circuit receives a clock signal and an input signal, and constructs a latch circuit latching a logic level of the input signal given to an input terminal, which is connected to the first storage node, in response to said clock signal.

* * * * *